United States Patent [19]

Lysinger

[11] Patent Number: 5,784,331
[45] Date of Patent: Jul. 21, 1998

[54] MULTIPLE ACCESS MEMORY DEVICE

[75] Inventor: Mark A. Lysinger, Carrollton, Tex.

[73] Assignee: SGS-Thomson Microelectronics, Inc., Carrollton, Tex.

[21] Appl. No.: 775,664

[22] Filed: Dec. 31, 1996

[51] Int. Cl.[6] ........................ G11C 8/00
[52] U.S. Cl. .............. 365/230.06; 365/189.05; 365/230.08
[58] Field of Search .............. 365/230.06, 230.08, 365/189.05

[56] References Cited

U.S. PATENT DOCUMENTS

| 5,124,951 | 6/1992 | Slemmer et al. | 365/230.06 |
|---|---|---|---|
| 5,261,064 | 11/1993 | Wyland | 395/400 |
| 5,282,173 | 1/1994 | Miyaji et al. | 365/230.06 |
| 5,315,548 | 5/1994 | Ooishi et al. | 365/230.06 |
| 5,319,759 | 6/1994 | Chan | 395/400 |
| 5,453,957 | 9/1995 | Norris et al. | 365/230.04 |
| 5,469,391 | 11/1995 | Haraguchi | 365/230.06 |
| 5,526,320 | 6/1996 | Zagar et al. | 365/233.5 |

*Primary Examiner*—Son T. Dinh
*Attorney, Agent, or Firm*—David V. Carlson; Theodore E. Galanthay; Lisa K. Jorgenson

[57] ABSTRACT

A memory circuit has a plurality of data storage locations and an address associated with each data storage location. A first decoded address storage circuit stores a first decoded memory address and outputs the stored first decoded memory address. A second decoded address storage circuit stores a second decoded memory address and outputs the stored second decoded memory address. An address access circuit is coupled to the output of the first decoded address storage circuit and accesses the data storage location associated with the first decoded memory address in response to the first decoded memory address being output from the first decoded address storage circuit. A control circuit is coupled to the first decoded address storage circuit for controlling the transfer of decoded memory address information from the second decoded address storage circuit to the first decoded address storage circuit.

13 Claims, 22 Drawing Sheets

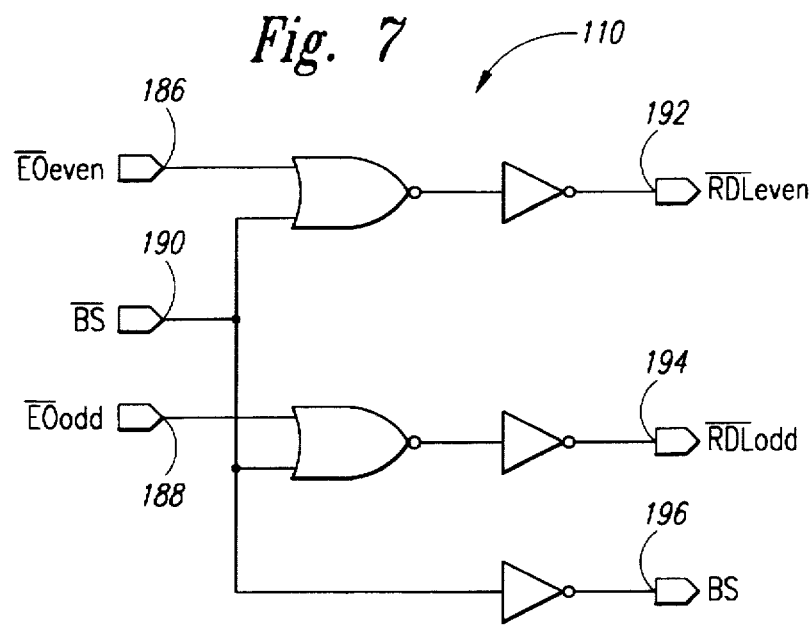
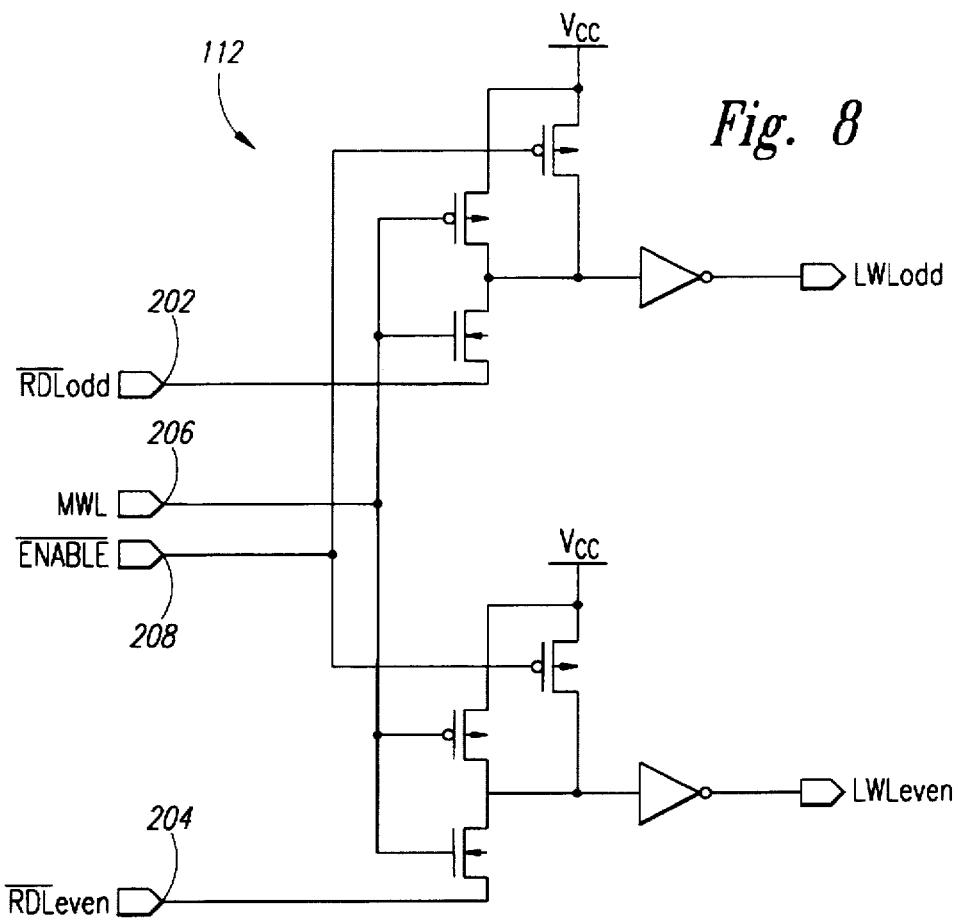

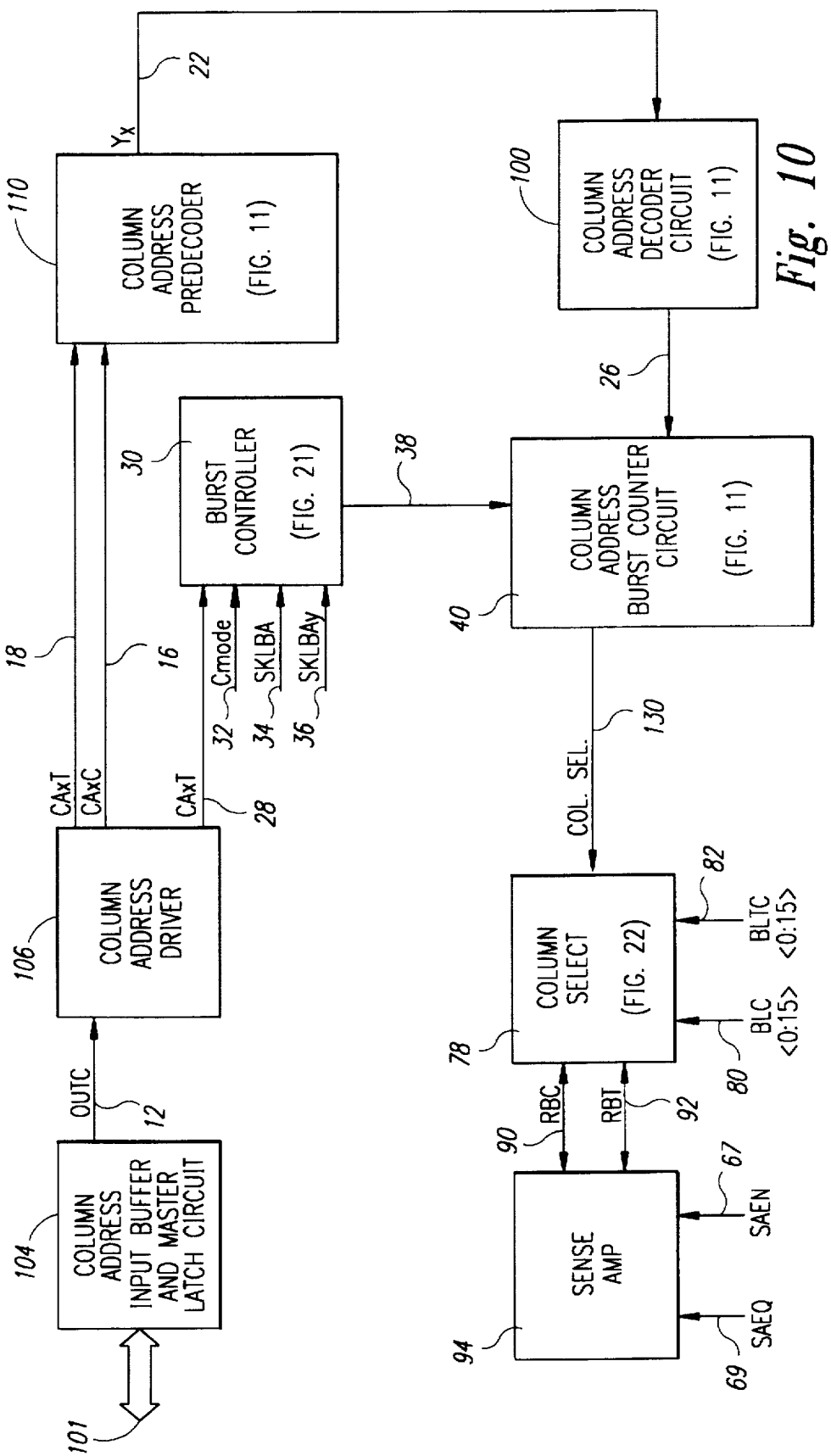

MULTIPLE ACCESS MEMORY DEVICE

CROSS-REFERENCE TO RELATED APPLICATIONS

The following pending U.S. patent applications by David C. McClure entitled: "Architecture Redundancy," Ser. No. 08/582,424 (Attorney's Docket No. 95-C-136), and "Redundancy Control," Ser. No. 08/580,827 (Attorney's Docket No. 95-C-143), which were filed on Dec. 29, 1995, and have the same ownership as the present application, and to that extent are related to the present application, which are incorporated herein by reference; and entitled: "Test Mode Activation And Data Override," Ser. No. 08/587,709 (Attorney's Docket No. 95-C-137), "Pipelined Chip Enable Control Circuitry And Methodology," Ser. No. 08/588,730 (Attorney's Docket No. 95-C-138), "Output Driver Circuitry Having A Single Slew Rate Resistor," Ser. No. 08/588,988 (Attorney's Docket No. 95-C-139), "Synchronous Stress Test Control," Ser. No. 08/589,015 (Attorney's Docket No. 95-C-142), "Write Pass Through Circuit," Ser. No. 08/588,662 (Attorney's Docket No. 95-C-144), "Data-Input Device For Generating Test Signals On Bit And Bit-Complement Lines," Ser. No. 08/588,762 (Attorney's Docket No. 95-C-145), "Synchronous Output Circuit," Ser. No. 08/588,901 (Attorney's Docket No. 95-C-146), "Write Driver Having A Test Function," Ser. No. 08/589,141 (Attorney's Docket No. 95-C-147), "Circuit And Method For Tracking The Start Of A Write To A Memory Cell," Ser. No. 08/589,139 (Attorney's Docket No. 95-C-148), "Circuit And Method For Terminating A Write To A Memory Cell," Ser. No. 08/588,737 (Attorney's Docket No. 95-C-149), "Clocked Sense Amplifier With Word Line Tracking," Ser. No. 08/587,782 (Attorney's Docket No. 95-C-150), "Memory-Row Selector Having A Test Function," Ser. No. 08/589,140 (Attorney's Docket No. 95-C-151), "Synchronous Test Mode Initialization," Ser. No. 08/588,729 (Attorney's Docket No. 95-C-153), "Device And Method For Isolating Bit Lines From A Data Line," Ser. No. 08/588,740 (Attorney's Docket No. 95-C-154), "Circuit And Method For Setting The Time Duration Of A Write To A Memory Cell," Ser. No. 08/587,711 (Attorney's Docket No. 95-C-156), "Low-Power Read Circuit And Method For Controlling A Sense Amplifier," Ser. No. 08/589,024 (Attorney's Docket No. 95-C-168), "Device And Method For Driving A Conductive Path With A Signal," Ser. No. 08/587,708 (Attorney's Docket No. 95-C-169), and the following pending U.S. patent application by Mark A. Lysinger entitled: "Burst Counter Circuit And Method of Operation Thereof," Ser. No. 08/589,023 (Attorney's Docket No. 95-C-141A), all of which have the same effective filing date and ownership as the present application, and to that extent are related to the present application, which are incorporated herein by reference.

FIELD OF THE INVENTION

This invention is related generally to a burst counter circuit and more specifically to a pipelined address scheme for storing a second decoded memory address while the burst counter circuit is accessing memory locations associated with a first decoded memory address.

BACKGROUND OF THE INVENTION

As synchronous burst SRAMs become more popular, market pressure to improve performance is increased. Part of the increased performance has been obtained by pipelining data. While pipelining data increases the speed at which the data is provided to a user, it does not increase the speed of the cycle time nor shorten the overall time required to get data into or out of specific addresses within a memory array.

One known technique for increasing the speed at which data is read out of a memory is to use a burst counter which increments the input and memory address under the control of a clock without requiring new address to be input. Prior art burst SRAMs used a burst counter which manipulated the address signal before it was input to the address decoder circuit. In these SRAMs, the output of the burst counter was then passed to an address decoder. This type of burst counter could also easily be attached to the front of existing synchronous designs with no significant changes required to the memory core or to the synchronous decoder. Using this technique, the memory could use well known and reliable decoder circuits to select the rows and columns. One downside of this approach is that all address transitions must still propagate through the address decoder. The speed at which address signals can propagate through the address decoder may become a limiting factor at faster cycle times.

SUMMARY OF THE INVENTION

According to principles of the present invention, a memory circuit has a plurality of data storage locations and an address associated with each data storage location. A first decoded address storage circuit stores a first decoded memory address and holds it for accessing a particular memory address. A second decoded address storage circuit stores a second decoded memory address and holds it for accessing a second decoded memory address. A control circuit is coupled to the first decoded address storage circuit and operates to transfer decoded memory address information from the second decoded address storage circuit to the first decoded address storage circuit.

In one embodiment, a counter circuit is coupled to the output of the first decoded address storage circuit for accessing the data storage location associated with the first decoded memory address in response to the first decoded memory address being output from the first decoded memory circuit. The counter circuit includes a burst counter circuit which accesses the data storage location associated with the first decoded memory address and also accesses three additional data storage locations, the decoded memory addresses associated with these three additional data storage locations being generated by the burst counter circuit using the first decoded memory address.

BRIEF DESCRIPTION OF THE DRAWINGS

FIG. 7 is a detailed schematic of the word line select circuit of FIG. 3.

FIG. 8 is a detailed schematic of the local word line drive circuit of FIG. 3.

3

Figure 9A:
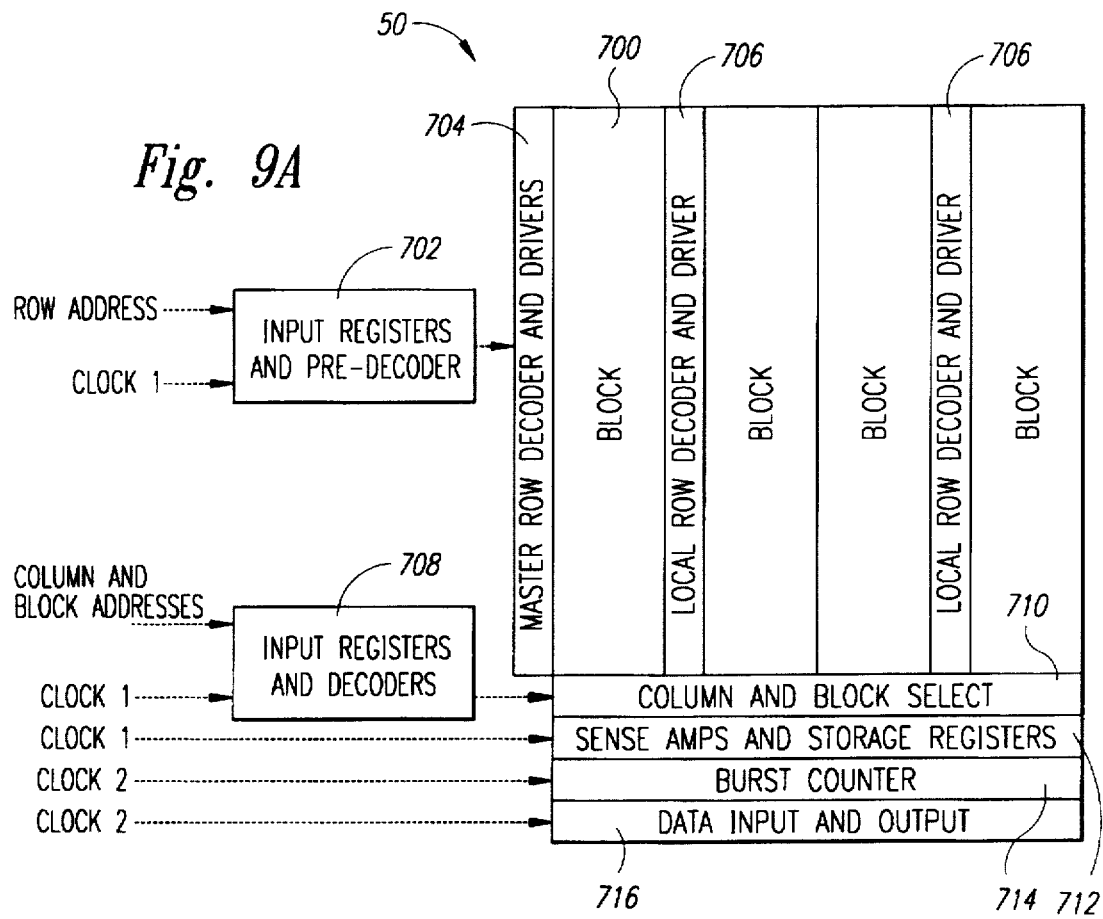
FIG. 9A is a block diagram of an SRAM in accordance with one embodiment of the present invention.
Figure 9B:
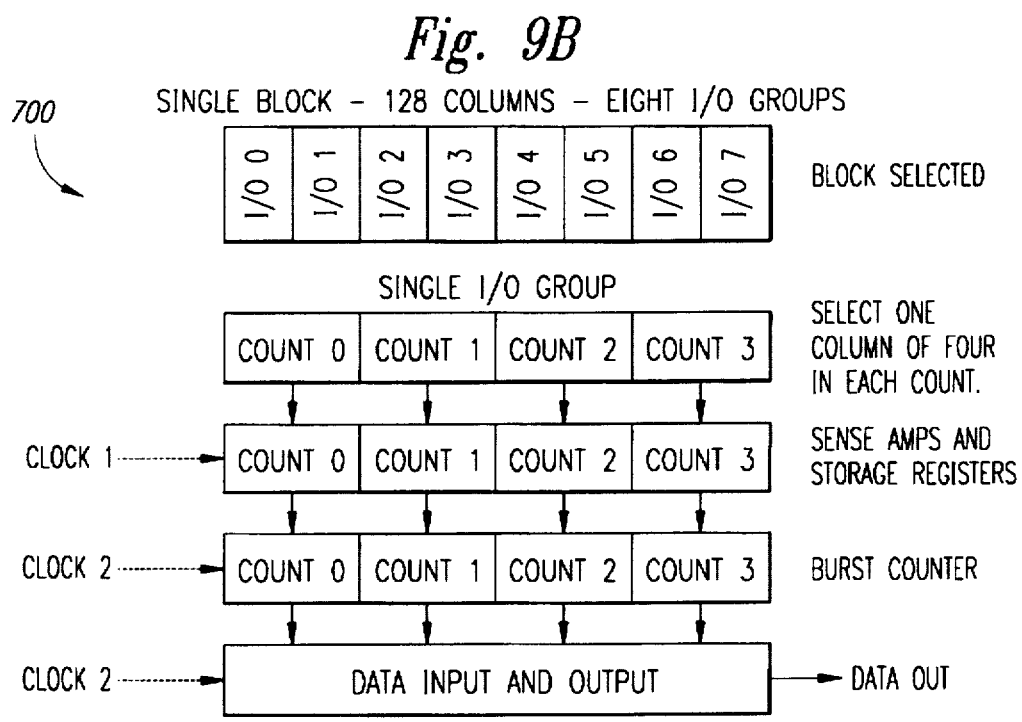

FIG. 9B is a detailed block diagram of one of the blocks of the SRAM of FIG. 9A.

FIG. 10 is a block diagram of the pipelined column address burst counter circuit in accordance with one embodiment of the present invention.

Figure 11:
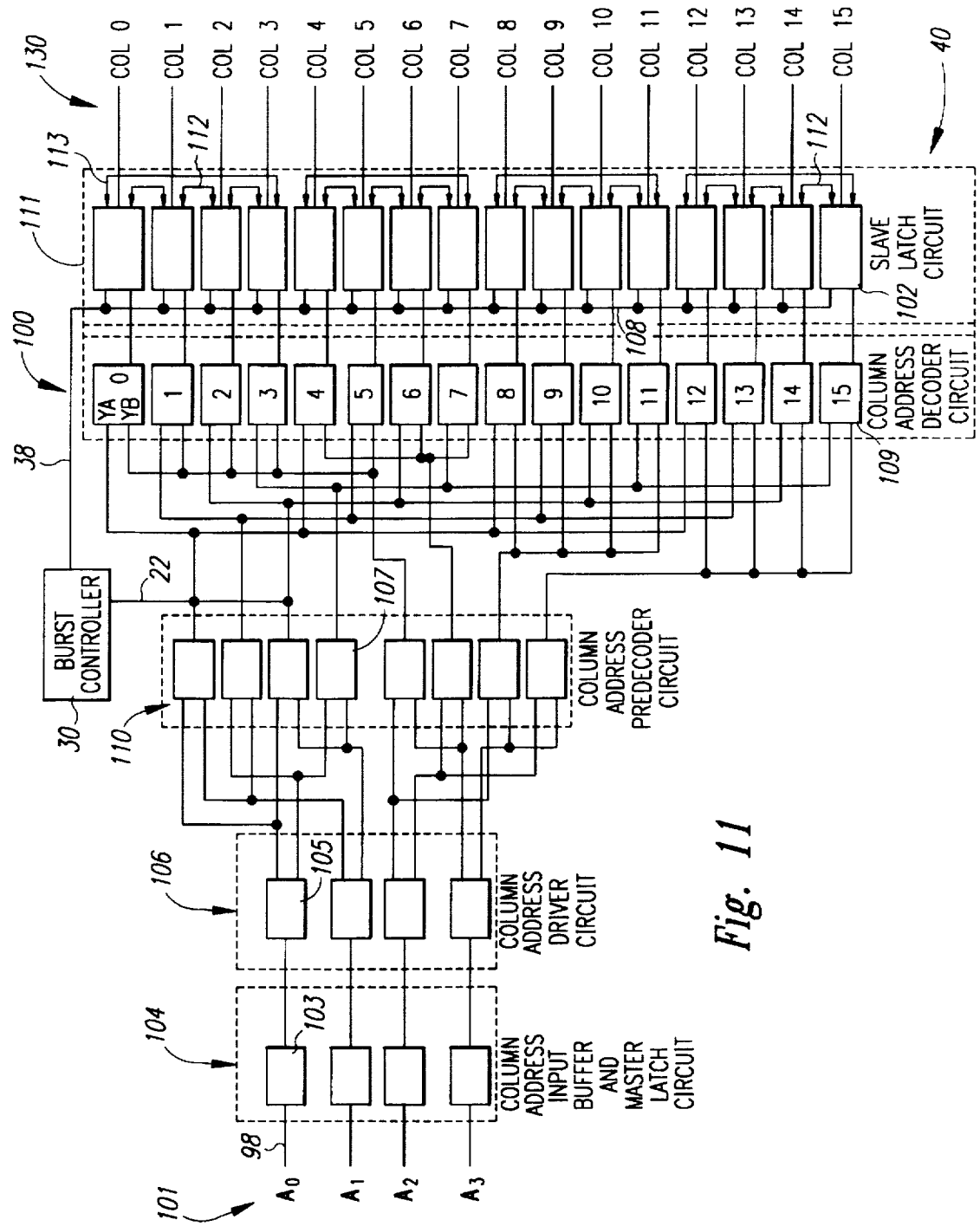

FIG. 11 is a more detailed block diagram of one embodiment of the pipelined column address burst counter circuit of the present invention.

Figure 12:
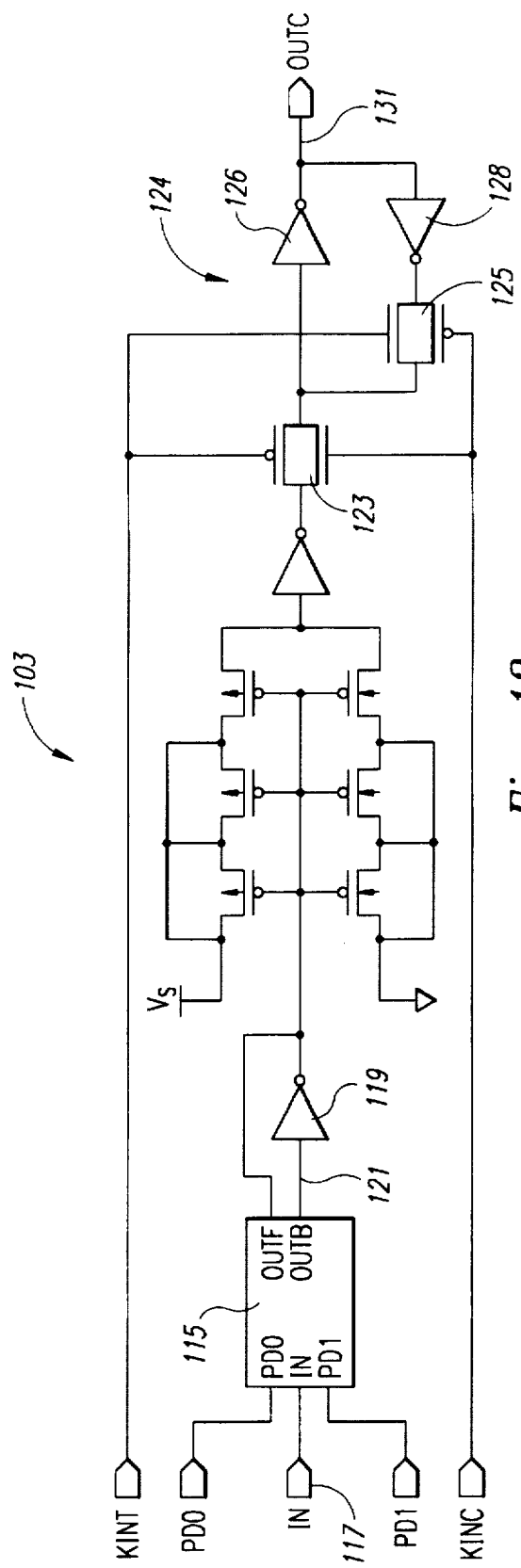

FIG. 12 is a schematic of the column address input buffer and master latch circuit of FIG. 11.

Figure 13:
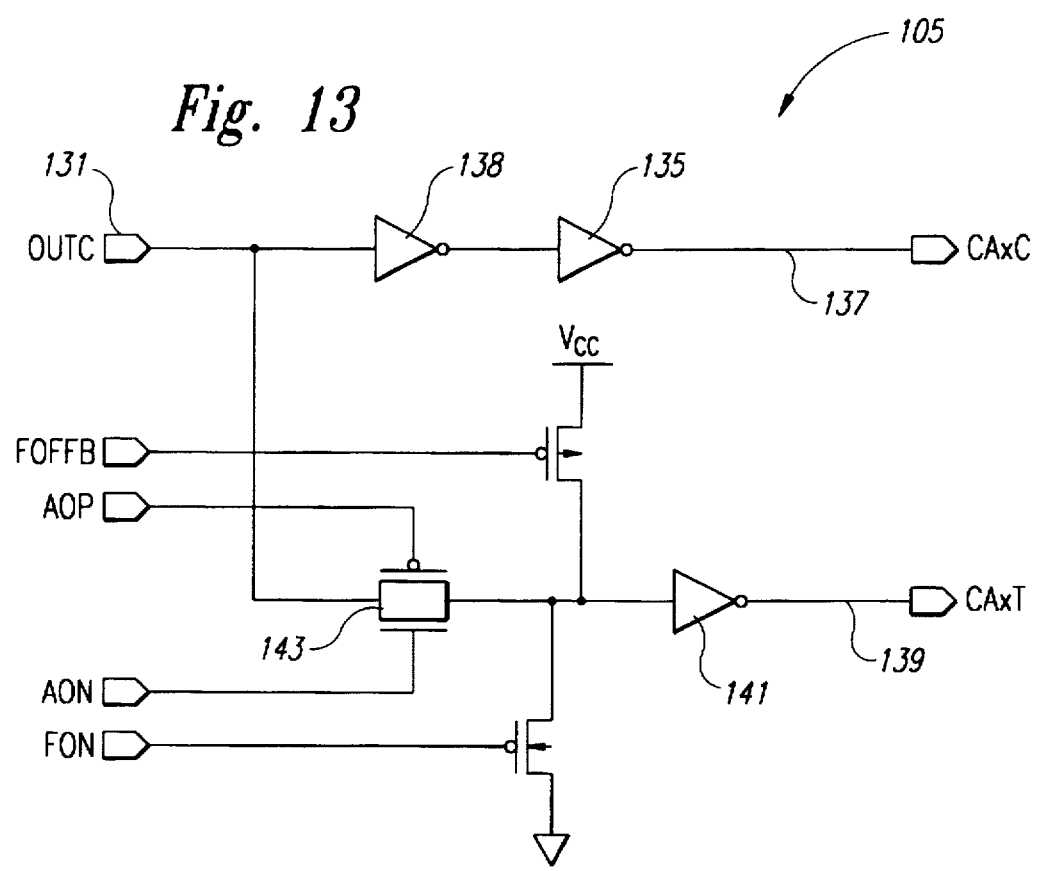

FIG. 13 is a schematic of the column address driver circuit of FIG. 11.

Figure 14:
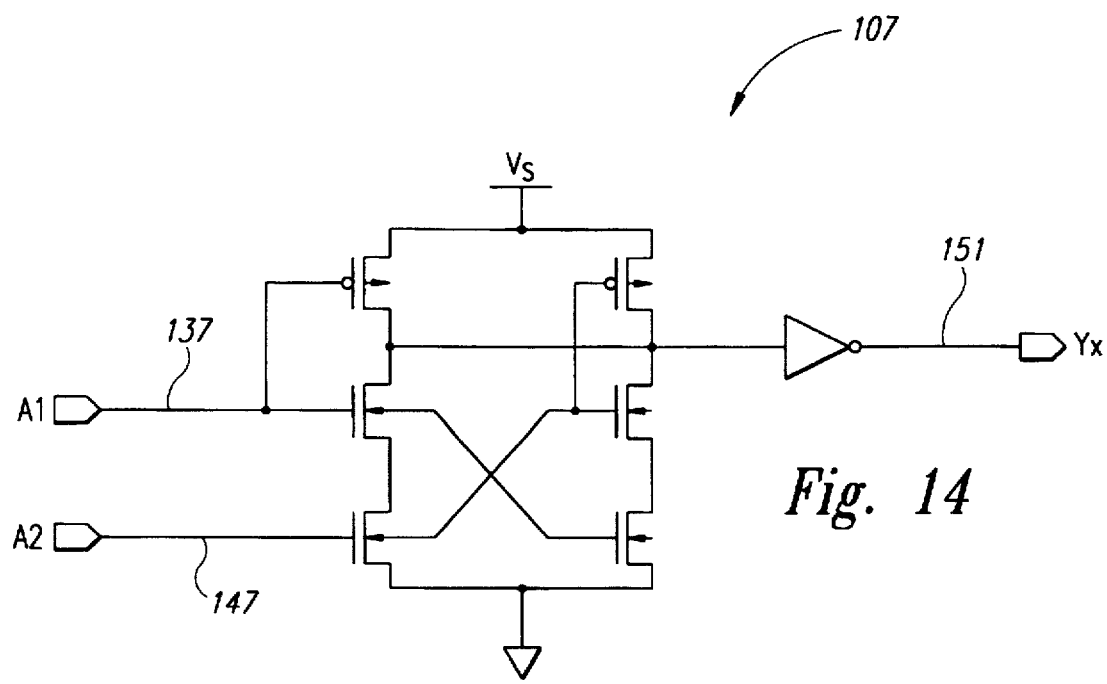

FIG. 14 is a schematic of the column address predecoder circuit of FIG. 11.

Figure 15:
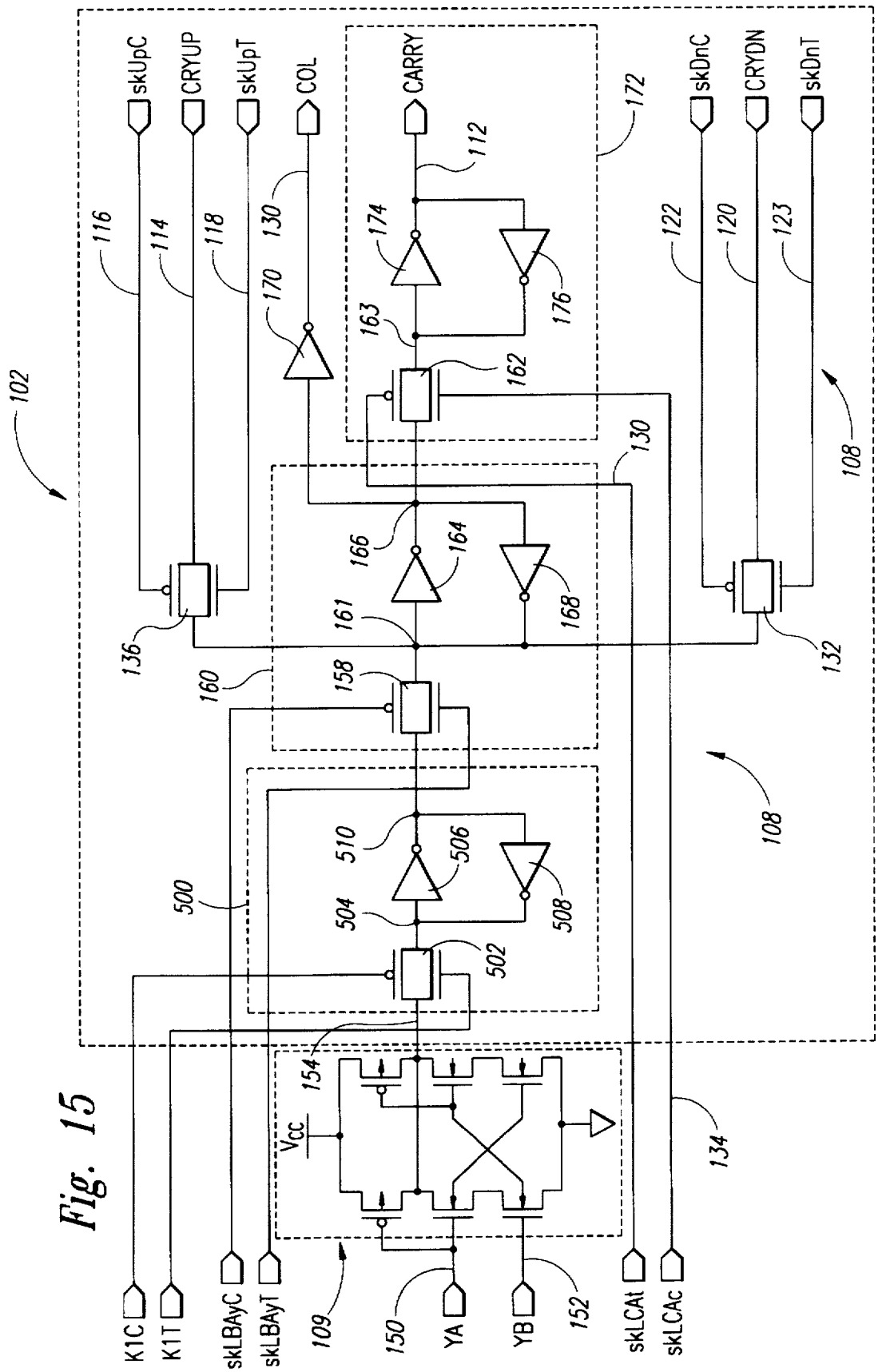

FIG. 15 is a schematic of one embodiment of the column address decoder circuit and slave latch circuit of FIG. 11.

Figure 16:
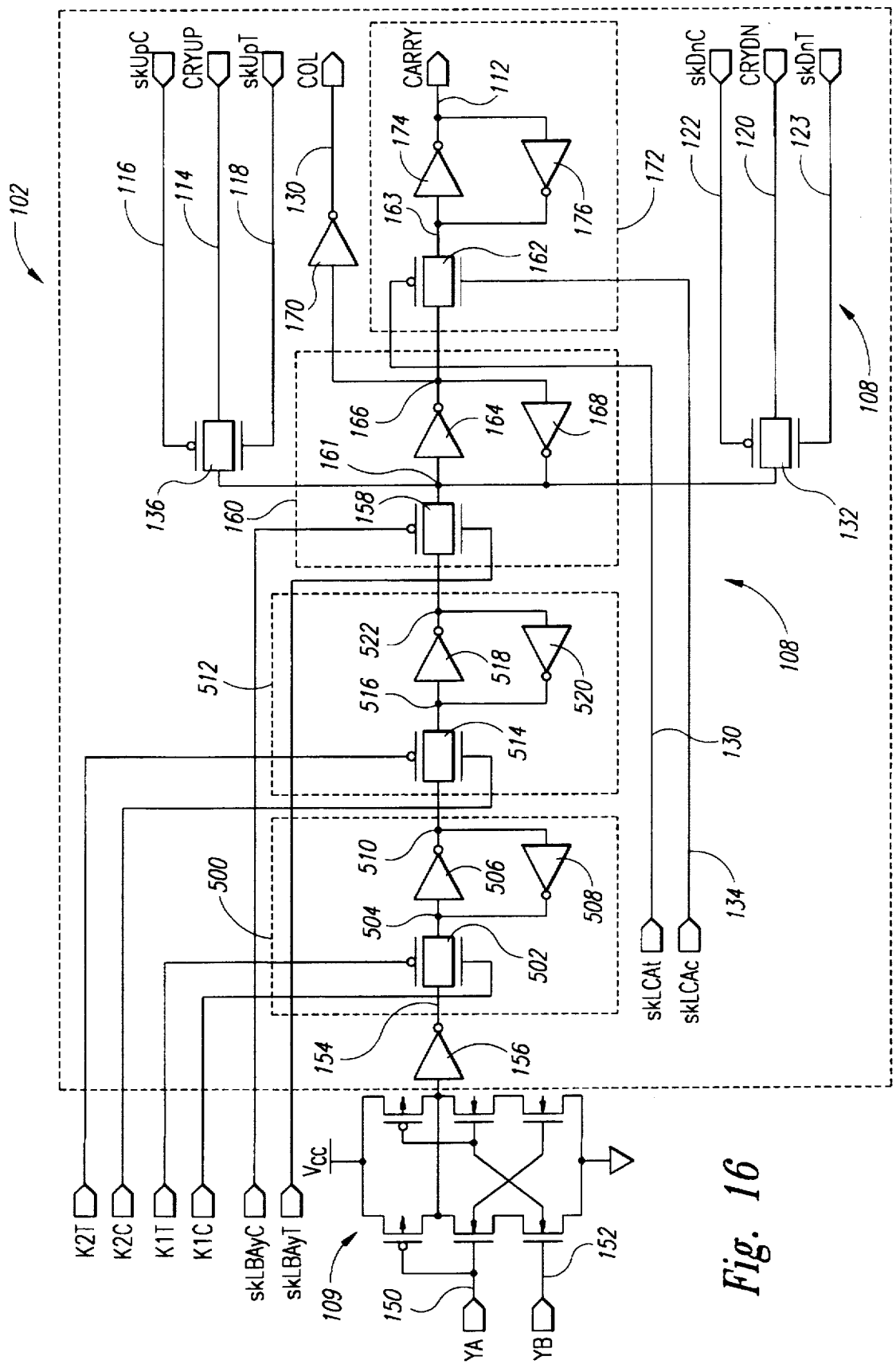

FIG. 16 is a schematic of another embodiment of the column address decoder circuit and slave latch circuit of FIG. 11.

Figure 17:
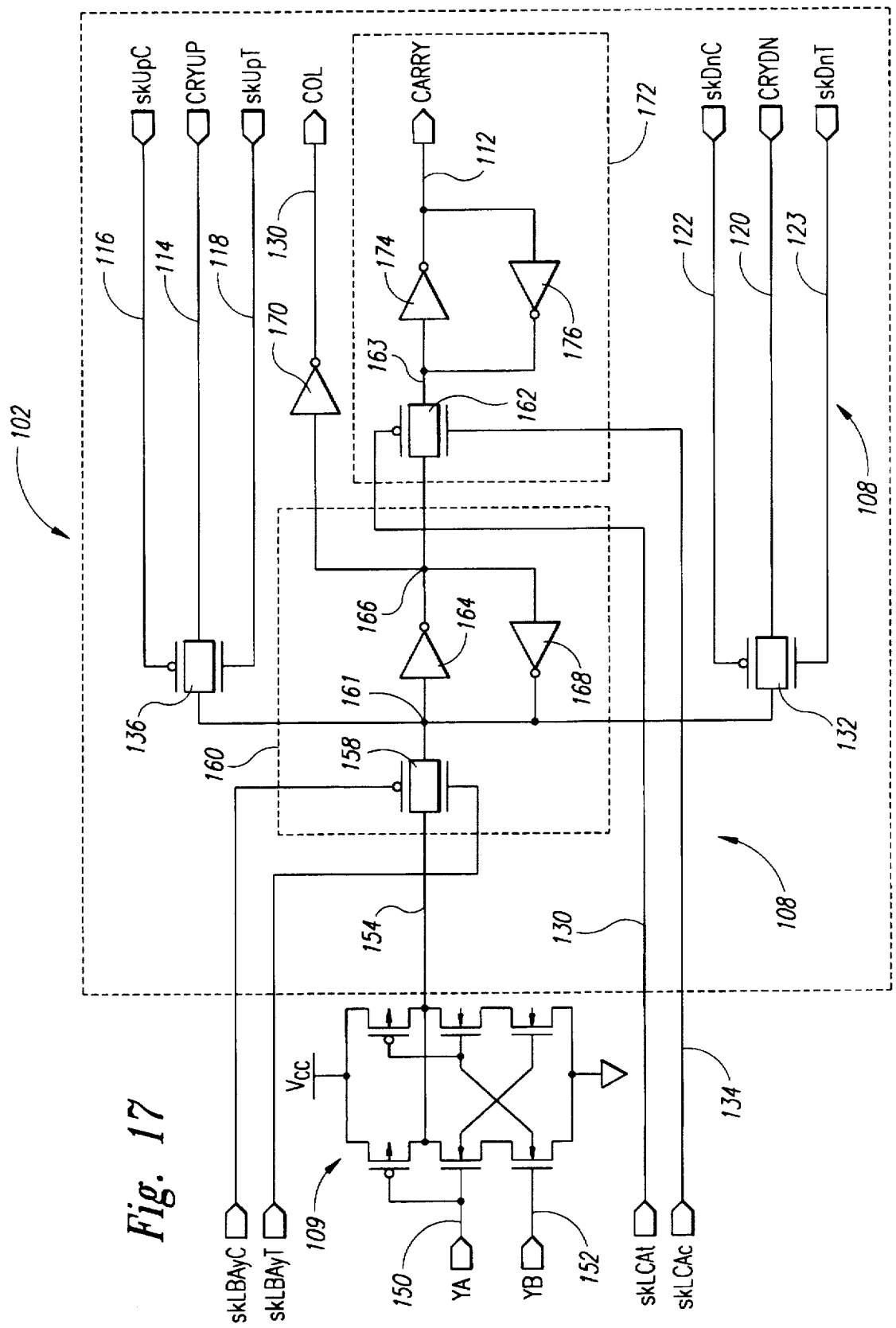

FIG. 17 is a schematic of still another embodiment of the column address decoder circuit and slave latch circuit of FIG. 11.

Figure 18:
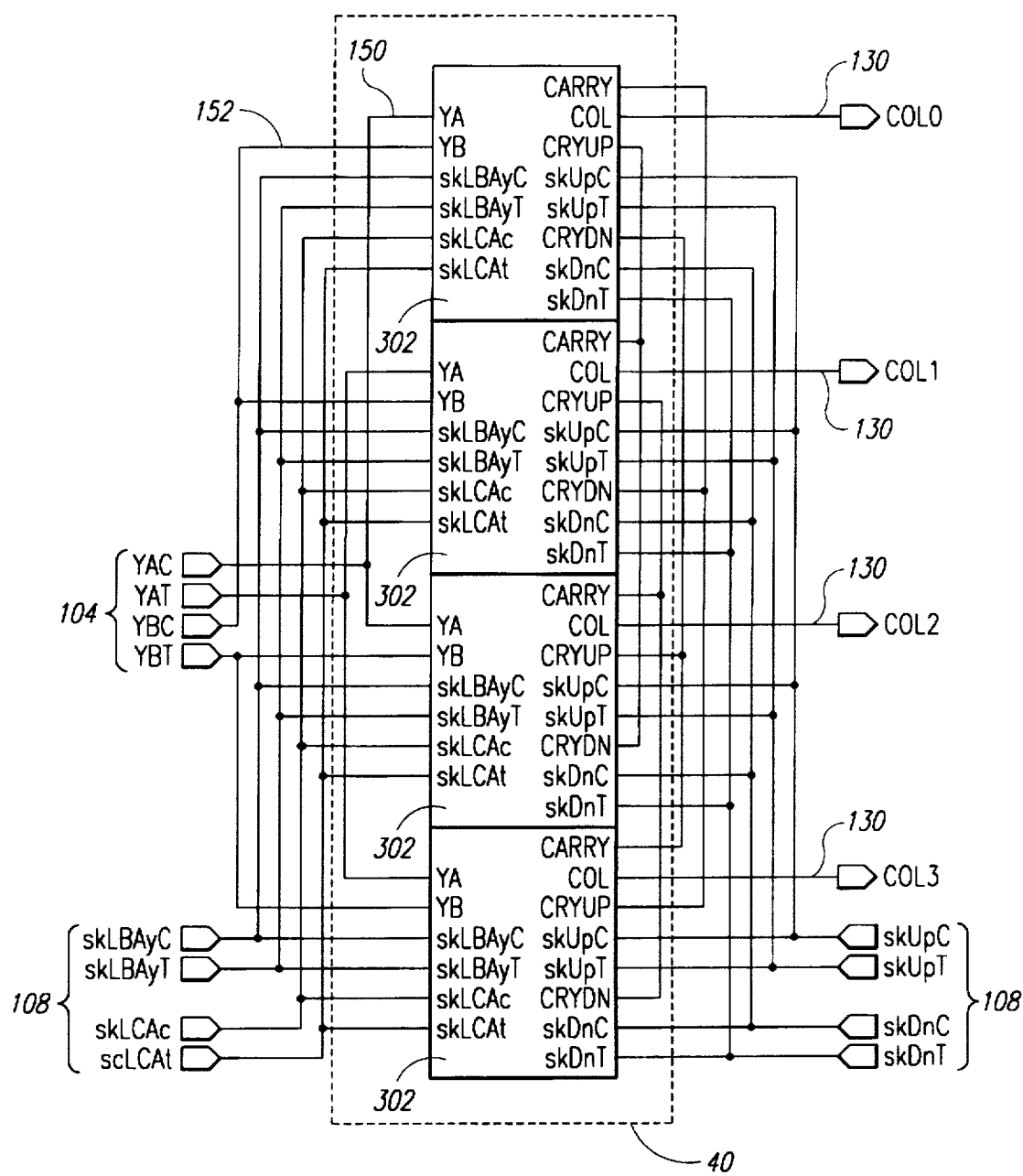

FIG. 18 is a functional block diagram of one embodiment of the burst counter circuit of FIG. 10.

Figure 19:
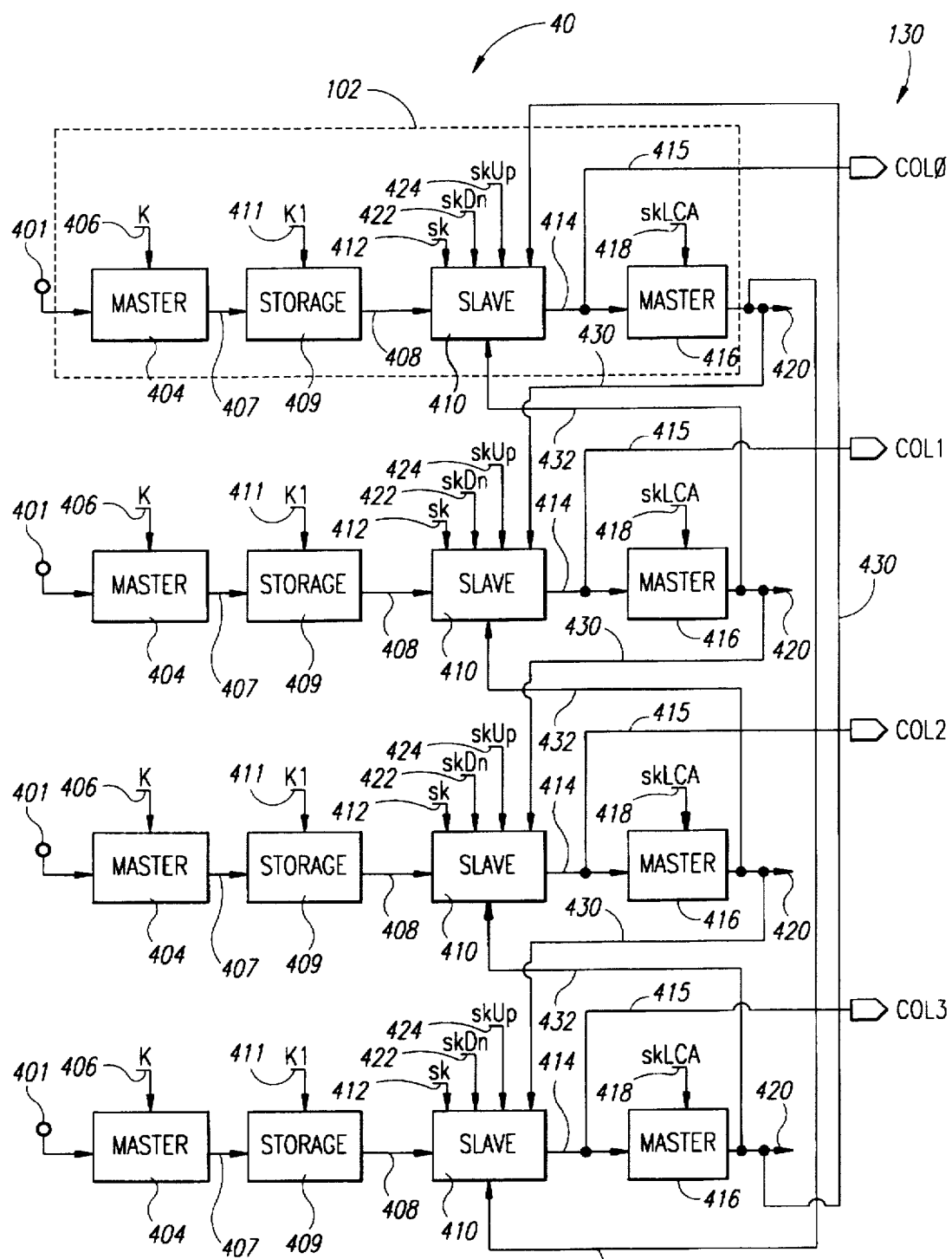

FIG. 19 is a functional block diagram of another embodiment of the burst counter circuit of FIG. 10 comprising a plurality of latches.

Figure 20:
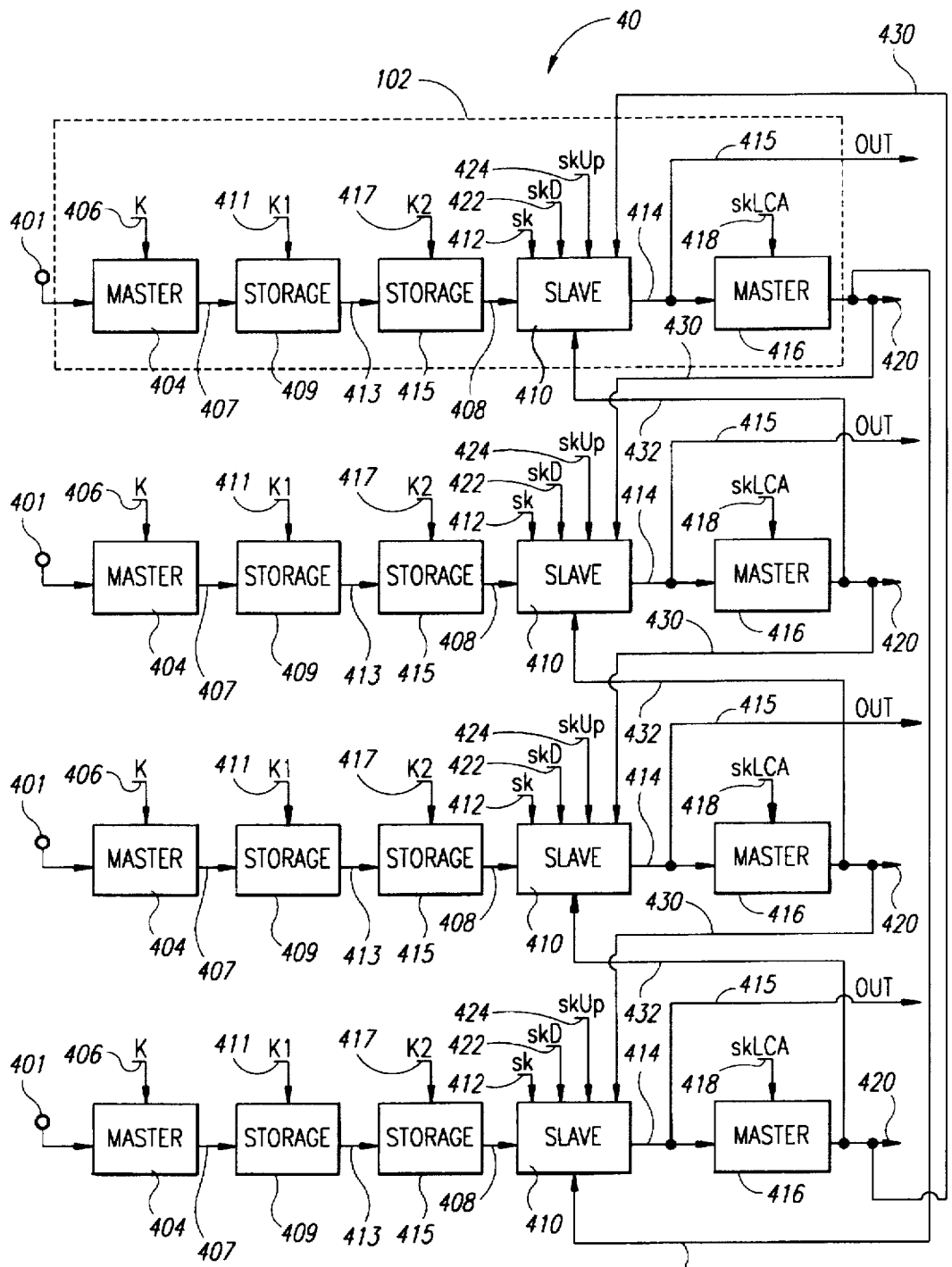

FIG. 20 is a functional block diagram of still another embodiment of the burst counter circuit of FIG. 10 comprising a plurality of latches.

Figure 21:
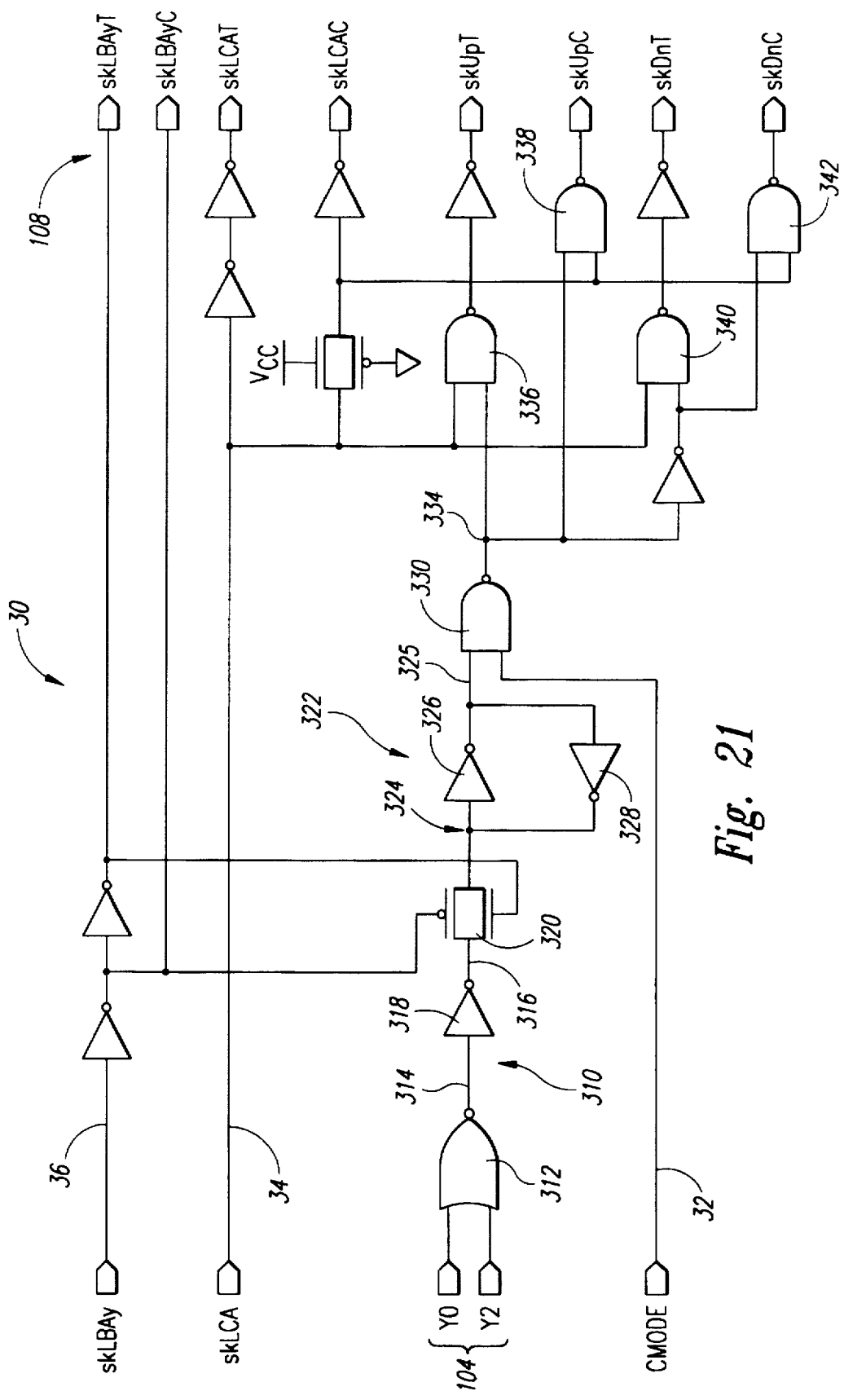

FIG. 21 is a schematic of the burst controller of FIG. 10.

Figure 22:
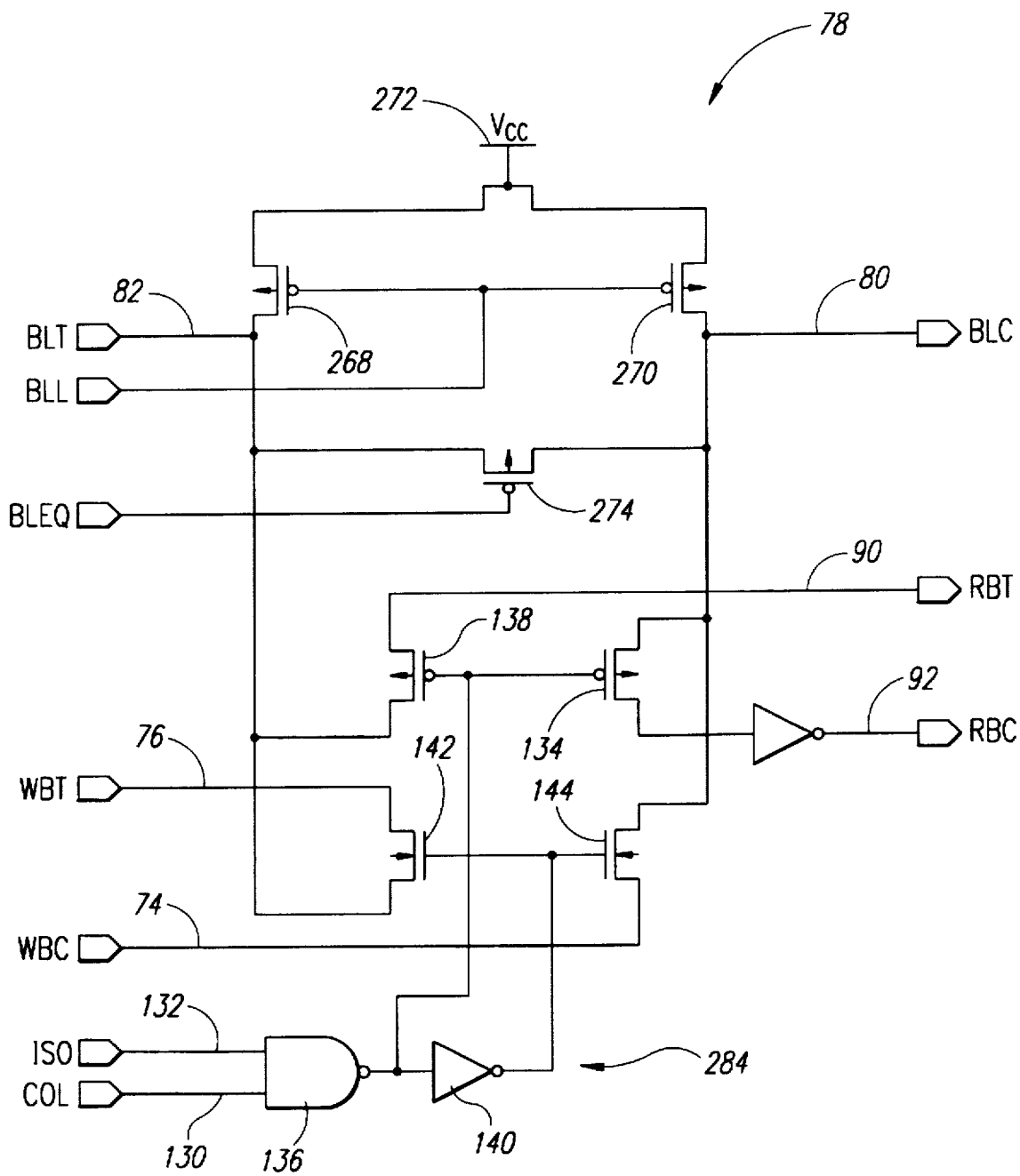

FIG. 22 is a schematic of the column select circuit of FIG. 10.

Figure 23:
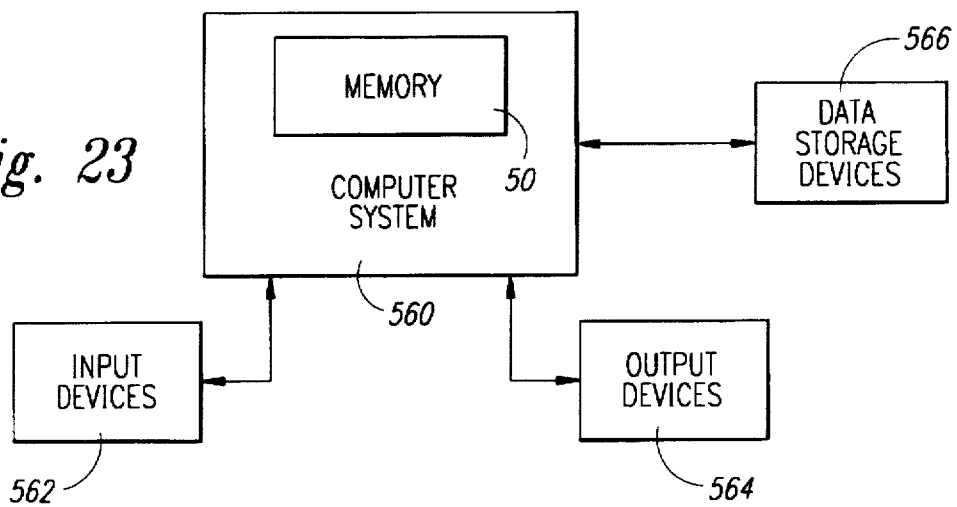

FIG. 23 is a block diagram of a computer system including a memory device according to the present invention.

Figure 24:
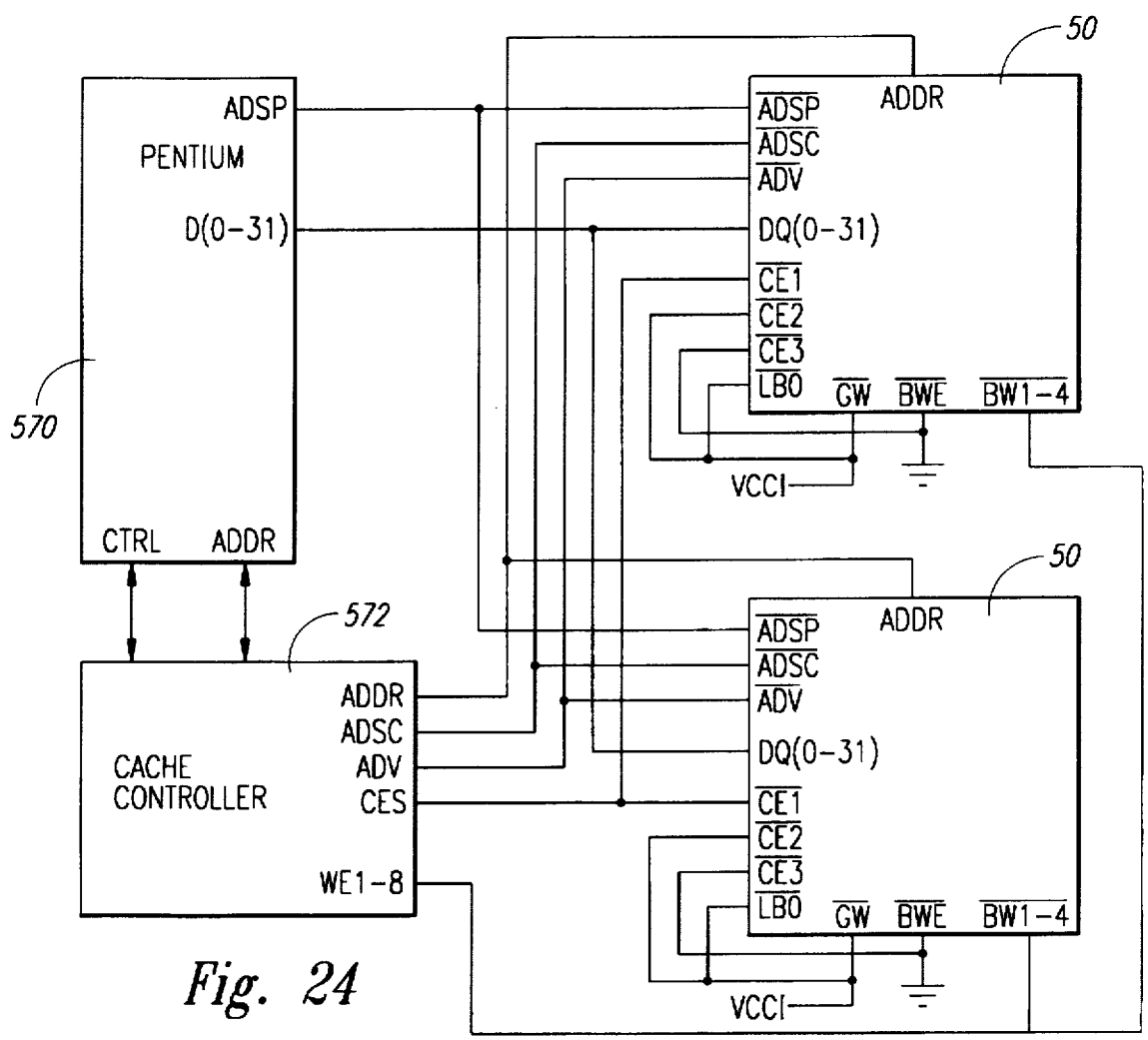
Figure 25:
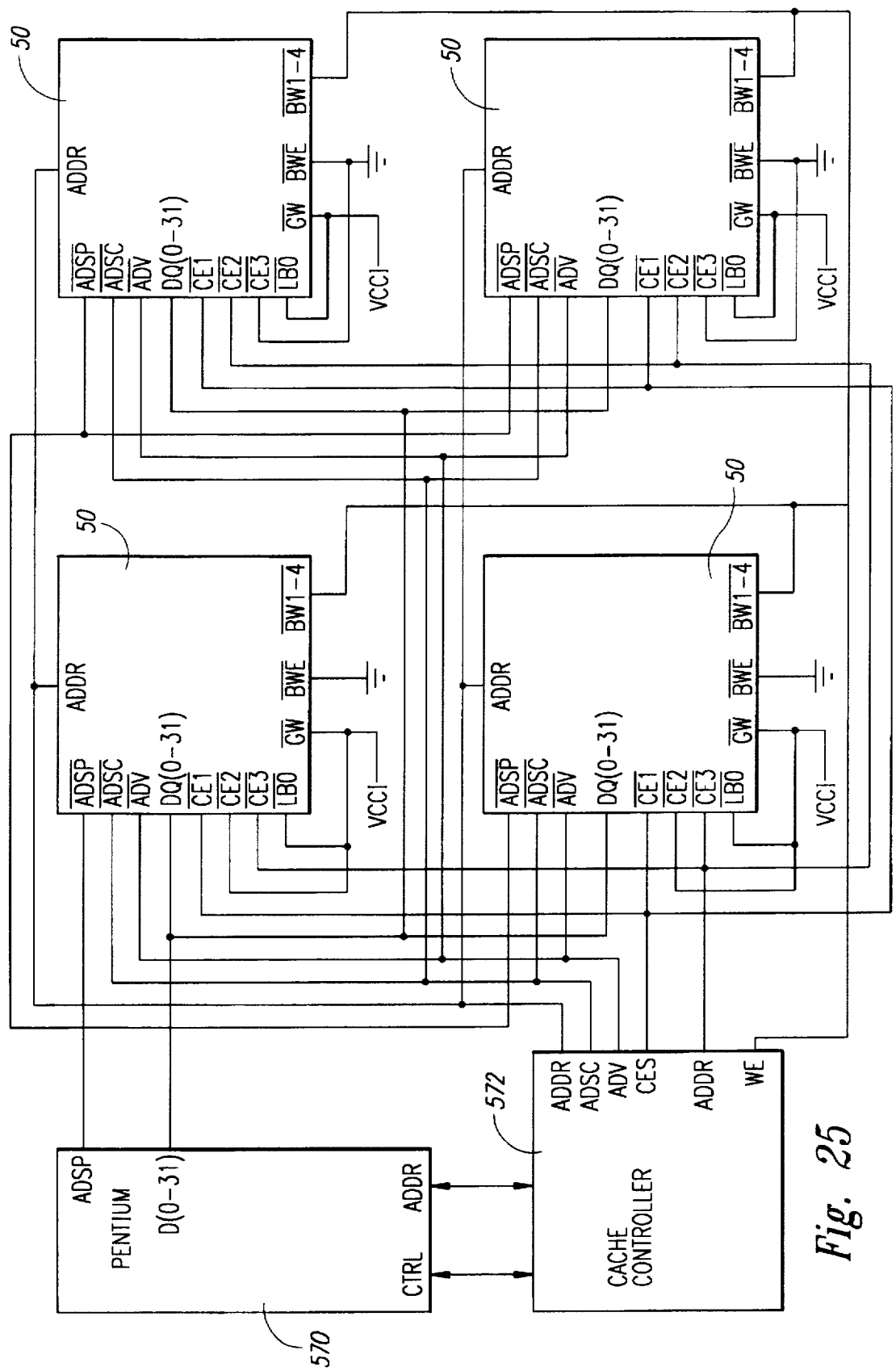

FIGS. 24 and 25 are block diagrams of alternative embodiments of computer systems using a memory device of the present invention.

DETAILED DESCRIPTION OF THE INVENTION

Figure 1:
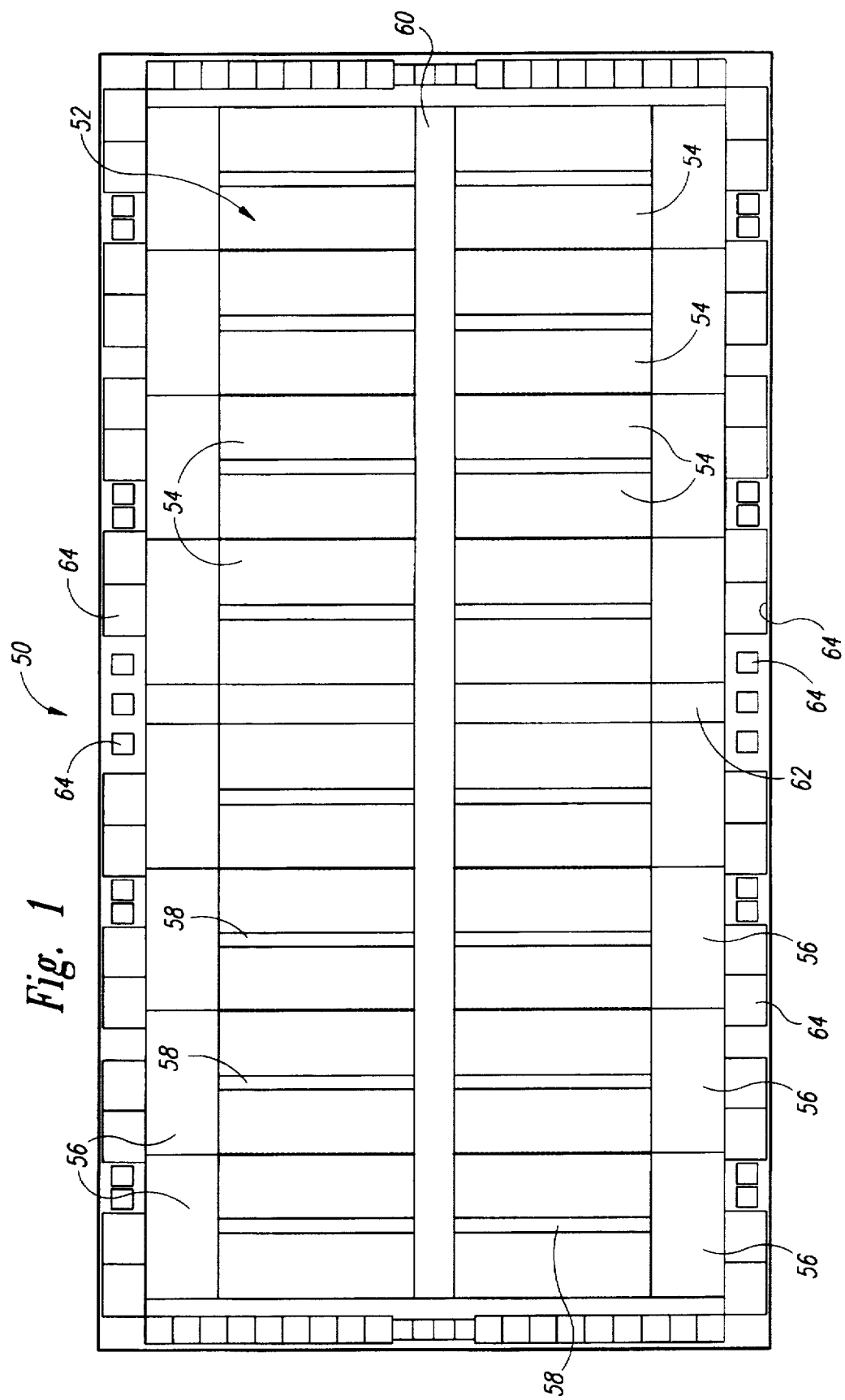
FIG. 1 is a block diagram of a memory device in accordance with the present invention.

FIG. 1 shows a memory device 50 having a memory array 52 thereon.

The memory array 52 is subdivided into a plurality of memory array blocks 54. The memory array 52 is subdivided into as many memory array blocks 54 as desired, according to the design. For example, eight blocks, nine blocks, or 16 blocks are rather common numbers of array blocks 54. In one embodiment, 32 memory array blocks 54 are formed as shown in FIG. 1. The 32 blocks are grouped into four quadrants, each quadrant having eight blocks. There are four quadrants on the memory device 50.

Associated with each memory array block 54 is a respective block input/output (I/O) circuit 56 and word line drive circuit 58. In one embodiment, the word line drive circuit 58 for two adjacent memory array blocks 54 is positioned in a single region between the two adjacent memory array blocks. Alternatively, the word line drive circuit 58 can be located in the central or peripheral regions of the memory device 50. Other circuitry for accessing a memory cell in the memory array 52, such as row and address decoders, input/output buffers and sense amplifiers are located in the block I/O circuitry 56, central regions 60 and 62 and other positions on the memory device 50 as needed. A plurality of bonding pads 64 are provided in the peripheral region of the memory device 50 for connecting to data input/output pins, voltage supply lines, address lines and other electrical connections as needed.

4

Figure 2:
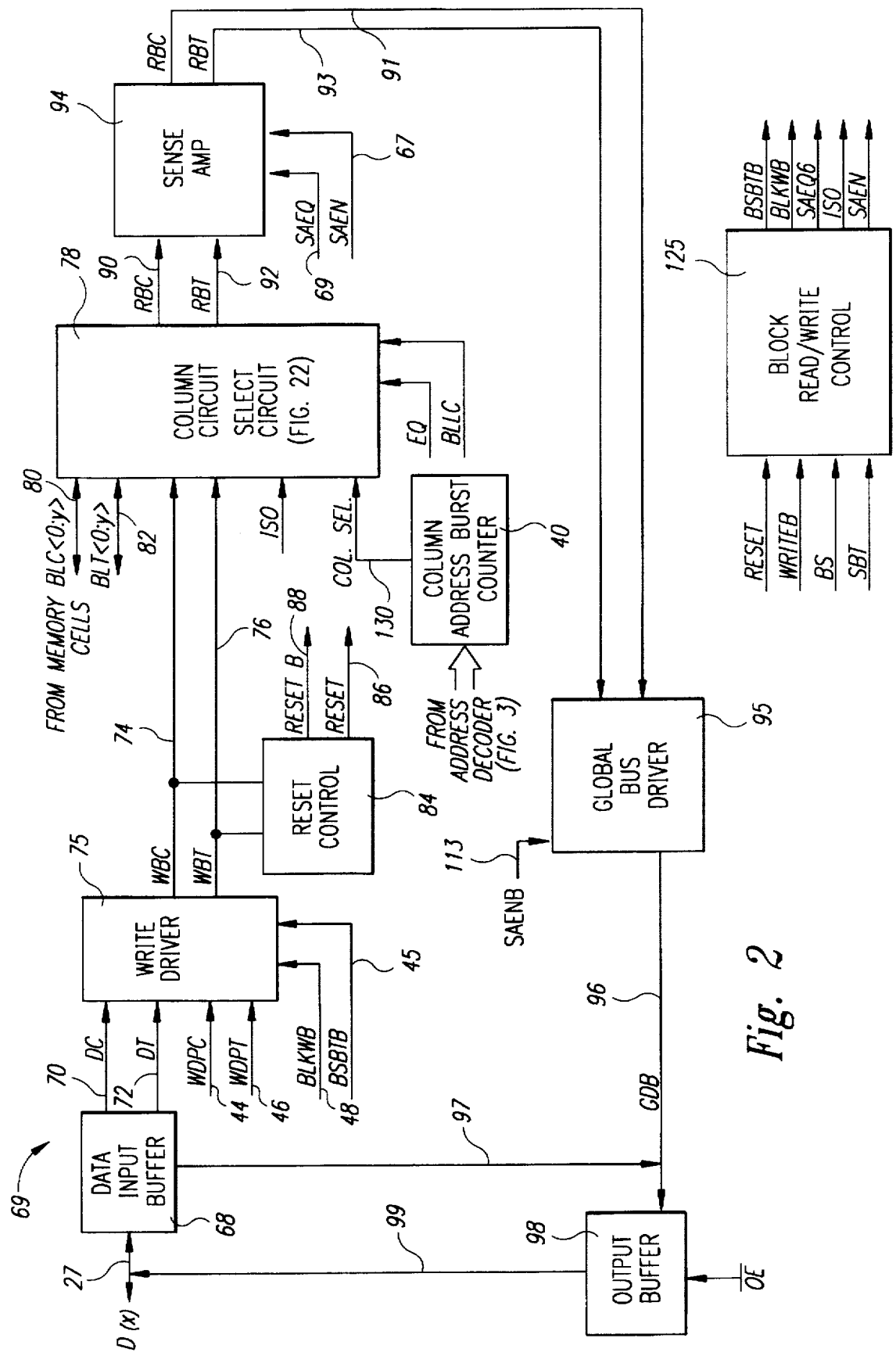
FIG. 2 is a block diagram of one embodiment of a read/write circuit of the memory device of FIG. 1.
Figure 3:
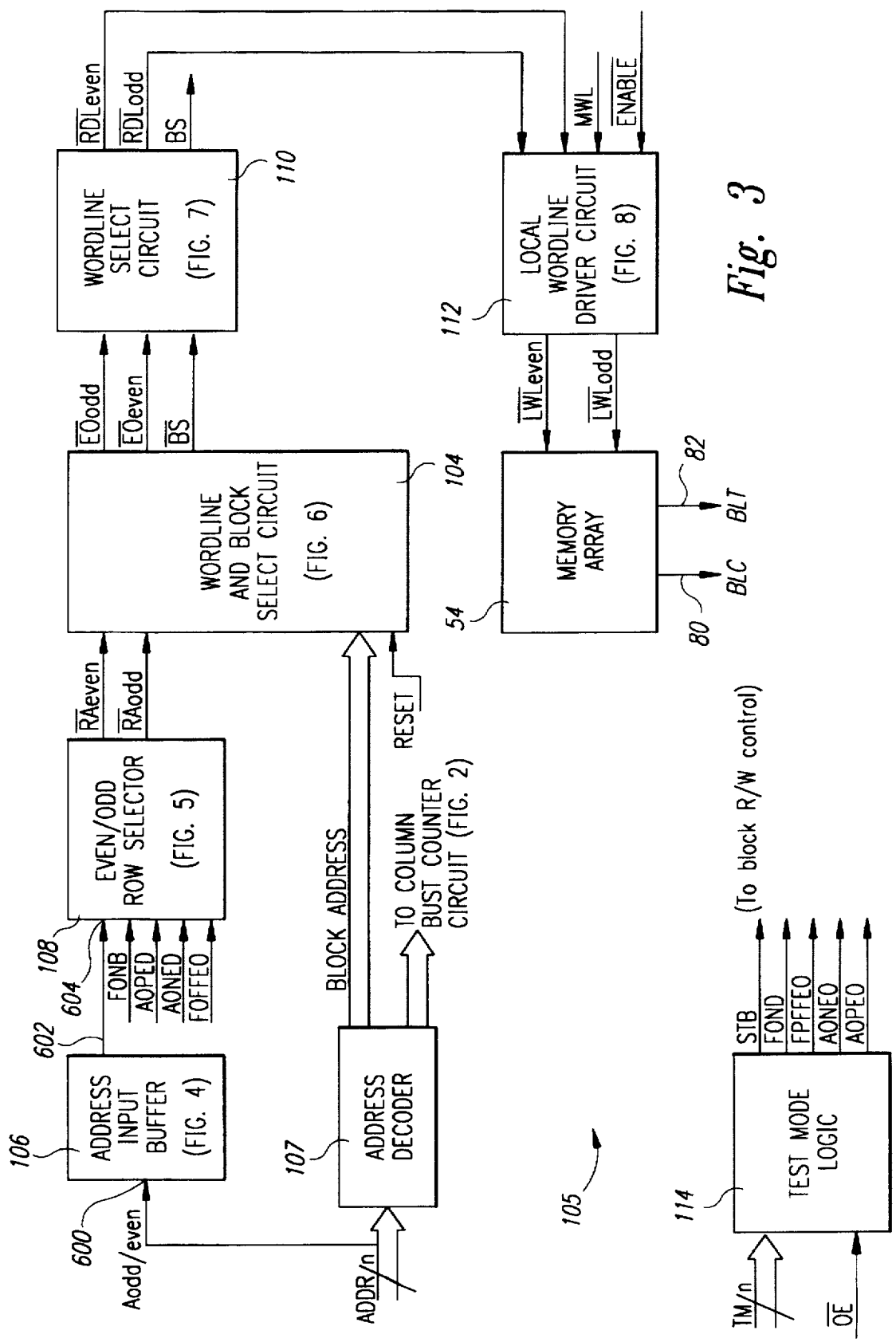
FIG. 3 is a block diagram of one embodiment of a row addressing circuit of the memory device of FIG. 1.

FIGS. 2 and 3 illustrate an embodiment of a read/write circuit 69 and a row address circuit 105, respectively, of the memory device 50. Each memory array block 54 is provided with circuitry for providing data to and from for that individual block. In one embodiment, the circuitry of FIGS. 2 and 3 will be provided for each memory array block 54 so that there are 32 such circuits on a single memory device 50. Alternatively, for that circuitry which can be shared between two memory array blocks 54, only 16 such circuits will be needed, as will be apparent to those of skill in the art. In one embodiment, the memory device 50 is capable of receiving 32 bits of data simultaneously and outputting 32 bits of data simultaneously. Therefore, all circuitry required to input and output 32 bits of data simultaneously is provided, such as 32 input/output buffers, and the like. The 32 bits can be provided by simultaneously accessing one memory cell in each of the 32 memory array blocks 54 or, alternatively, by accessing 8 memory cells in one memory array block within one quadrant and accessing four blocks one within each quadrant simultaneously. The circuits shown in FIGS. 2 and 3 are thus provided for each individual block of the memory array 52 and can have a 1 bit bus, an 8 bit bus, a 4 bit bus or the like.

As shown in FIG. 2, a data signal line 27 receives data and provides the data to a conventional data input buffer 68. The data input buffer 68 outputs the data complement DC, on a signal line 70 and the data true DT, on a signal line 72. A write driver 75 receives the data from the data input buffer 68 and outputs the data on a pair of signal lines write bit complement, WBC 74 and write bit true, WBT 76. The data input buffer 68 also outputs the data to an output buffer 98 on line 97. The signal lines WBC 74 and WBT 76 are input to a column select circuit 78. The column select circuit 78 outputs the data on bit line complement BLC 80 and bit line true BLT 82 for writing to the memory array blocks 54. A burst counter 40 outputs column select signals 130 directly to the column select circuit 78 for addressing specific bit lines within the memory array block 54. The BLC line 80 and BLT line 82 are connected to the memory array block 54 as shown in FIG. 3. The WBC and WBT signal lines 74 and 76 are also connected to a reset control circuit 84 which outputs signal lines RESET 86 and reset bar (RESET B) 88. The column select circuit 78 also receives additional input signals to control reading and writing data to and from the memory array block 54 as explained in more detail with respect to FIG. 19. A read bit complement RBC 90 and a read bit true RBT 92 signal are output by the column select circuit 78 and carry the read bit data when the circuitry of the memory device 50 is in the read mode. The signals RBC 90 and RBT 92 are input to a sense amp circuit 94 which operates to sense read data in a manner well known in the art.

Referring to FIG. 3, the row address circuit 105 includes an address decoder 107 which receives address information and outputs decoded address information to a word line and block select circuit 104. Additional address decode circuitry including an input buffer 106, an even/odd row selector 108 and a word line select circuit 110 are part of the address decode circuitry. The word line select circuit 110 provides signals to a local word line driver circuit 112 which outputs signals LWL1 and LWL0 to drive individual word lines of the memory array block 54. As will be appreciated, the appropriate address decoder circuitry for the column address is also provided so that individual memory cells are accessible. Test mode logic 114 is also provided to permit testing of the memory device 50.

Figure 4:
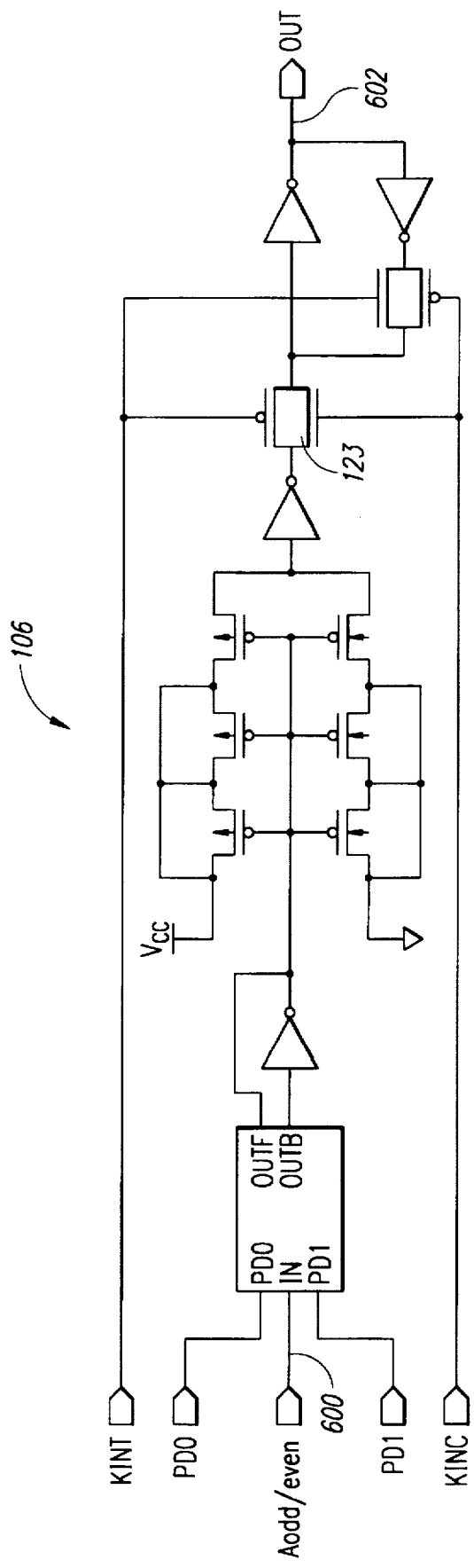
FIG. 4 is a schematic of the address input buffer of FIG. 3.

FIG. 4 is a schematic diagram of one embodiment of the address input buffer 106 of FIG. 3. The address input buffer 106 receives the odd/even address bit on an input terminal 600 and provides the buffered odd/even address bit on an output terminal 602.

Figure 5:
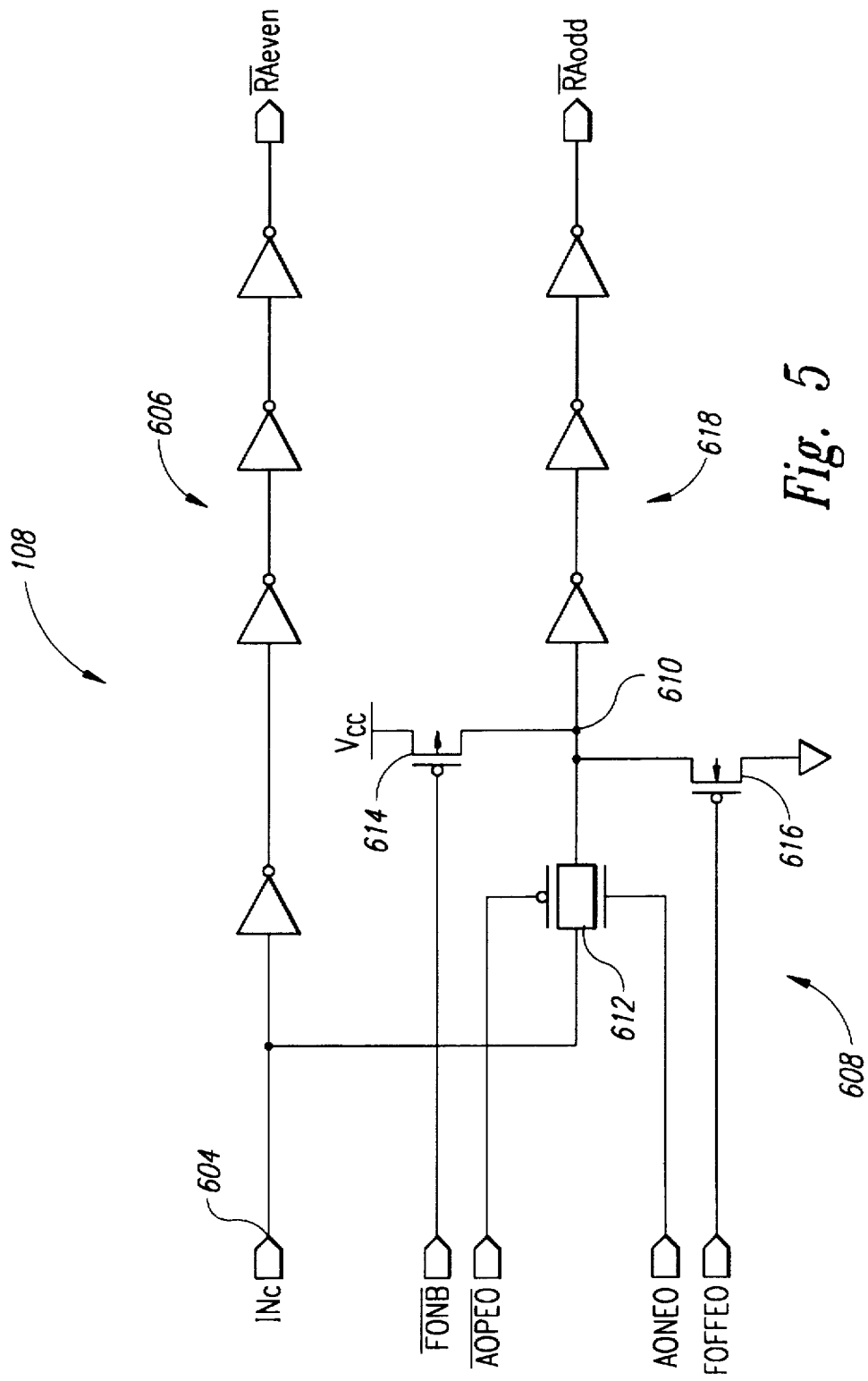
FIG. 5 is a schematic of the even/odd row selector of FIG. 3.

FIG. 5 is a schematic diagram of one embodiment of the even/odd row selector 108 of FIG. 3. A first stage 606 includes an even number (here 4) inverters that are serially coupled between the address input terminal 604 and a row address even terminal $\overline{RA}_{even}$. A mode selection stage 608 has a number of mode select input terminals coupled to the mode terminals $\overline{FONB}$, $\overline{AOPED}$, $\overline{AONEO}$, and $\overline{FOFFEO}$, an input terminal coupled to the input terminal 604, and an output terminal 610. The mode selection stage 608 includes switches 612, 614, and 616, which are coupled as shown. A second stage 618 includes an odd number (here 3) of inverters that are serially coupled between the output terminal 610 and the row address odd terminal $\overline{RA}_{odd}$.

In operation during a read or write cycle, the switch 612 is conducting, thus coupling the address bit at the terminal 604 to the stage 618. The switches 614 and 616 are non-conducting. If the address bit at the input terminal 604 indicates that an even row is to be accessed, i.e., the address bit is a logic 0, then the stage 606 generates an active logic 0 for $\overline{RA}_{even}$, and the stage 618 generates an inactive logic 1 for $\overline{RA}_{odd}$. Thus, the addressed even row is selected, and all the remaining even rows and all the odd rows of memory cells in the memory blocks 54 are unselected. Conversely, if the address bit at the input terminal 604 is a logic 1 to indicate that an odd row is to be accessed, then the stage 606 drives $\overline{RA}_{even}$ to an inactive logic 1, and the stage 618 drives $\overline{RA}_{odd}$ to an active logic 0. Thus, the addressed odd row is selected and the remaining odd rows and all the even rows of memory cells in the blocks 54 are unselected.

Figure 6:
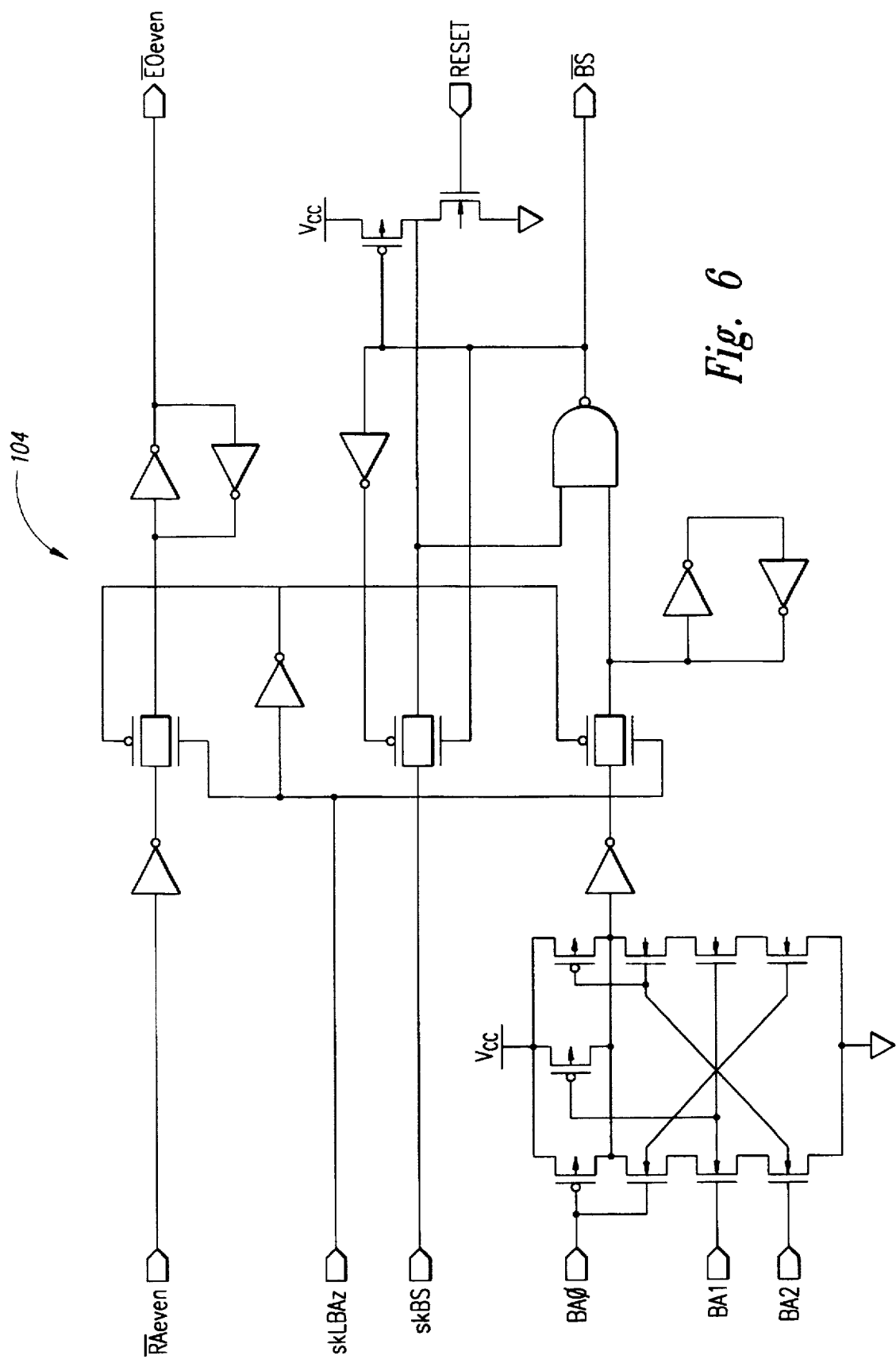
FIG. 6 is a detailed schematic of the word line and block select circuit of FIG. 3.

FIG. 6 is a schematic diagram of the word line and block select circuit 104 of FIG. 3. Only the portion that generates the $\overline{EO}_{even}$ signal is shown, it being understood that the portion generating the $\overline{EO}_{odd}$ signal is similar in construction and in operation. In operation, the circuit 104 receives $\overline{RA}_{even}$ and generates $\overline{EO}_{even}$. The circuit 104 also receives three block address signals BA0, BA1, and BA2 and generates therefrom a block select signal $\overline{BS}$. In one embodiment of the invention, there is one circuit 104 for every two memory blocks 54. The signals $\overline{EO}_{even}$ and $\overline{EO}_{odd}$ are common to all the memory blocks 54, and are generated by multiple circuits 104 in order to prevent problems such as excessive fan-out. Furthermore, in the embodiment of the memory device 50 where four (out of 32) memory blocks 54 are accessed at a time, only eight $\overline{BS}$ signals need be generated. Thus, each of these eight $\overline{BS}$ signals are coupled to a corresponding memory block 54 in each of the quadrants of the memory device 50.

FIG. 7 is a schematic diagram of one embodiment of the word line select circuit 110 of FIG. 3. In operation, the word line select circuit 110 generates $\overline{RDL}_{even}$ from $\overline{EO}_{even}$, $\overline{RDL}_{odd}$ from $\overline{EO}_{odd}$, and BS from $\overline{BS}$. The signals BS from two circuits 110 are coupled to the block read/write control circuit 125 (FIG. 2) as block select left BSL and block select right BSR, respectively.

FIG. 8 is a schematic diagram of one embodiment of the local word line driver circuit 112 of FIG. 3. The circuit 112 generates an active logic 1 for $\overline{LWL}_{even}$ when $\overline{RDL}_{even}$ is a logic 0 and MWL and $\overline{ENABLE}$ are logic 1 and 0, respectively. Likewise, the circuit 112 generates an active logic 1 for $\overline{LWL}_{odd}$ when $\overline{RDL}_{odd}$ is a logic 0 and MWL and $\overline{ENABLE}$ are logic 1 and 0, respectively. In one embodiment of the invention, each memory block 54 has 260 rows of memory cells and in such an embodiment there are 130 of the local word line driver circuits 112 per memory block 54.

The detailed circuits for each of the blocks shown in FIGS. 4 to 8 can be implemented using conventional circuitry now available for performing such functions. As will be appreciated, specific embodiments for such circuitry are shown and described in the related applications mentioned on page 1 of the present application. However, such detailed circuits do not form a part of this present invention and, for purposes of this invention, any currently available circuitry for carrying out the functions described in the blocks is acceptable.

FIG. 10 is a block diagram of one embodiment of a pipelined column address burst counter circuit according to principles of the present invention. A column address input buffer and master latch circuit 104 receives a column address 101 directly from input pins of the memory device 50. The circuit 104 outputs the column address data on line 12 labeled OUTC which is input to a column address driver 106. The column address driver 106 generates true and complement address signals corresponding to each address provided on the line 12. These include the true column address x on line 18, labeled CAxT, and the complement column address x on line 16, labeled CAxC. In the present embodiment, x is a number from 0 to 13 because there are 4 addresses that are decoded to selected 16 columns in a group. The column address signals, CAxT and CAxC, are input to a column predecoder 110. The true column address CAxT is also input on a line 28 to a burst controller 30. In a preferred embodiment, x=0 on the particular signal line 18 which is provided to the burst controller 30 so that the burst controller receives the least significant address bit from the current column address from the column address driver 106. The burst controller 30 outputs numerous control signals on multiple lines, labeled 38 as a group, to control a column address burst counter circuit 40. The details of this implementation of the burst controller 30 will be described in more detail later with respect to FIG. 21.

The column predecoder 110 receives the signals on lines 18 and 16 and outputs partially decoded address information, labeled Yx on line 22. The partially decoded column address information Yx is input to a column address decoder circuit 100. The decoded column address data is output by the column address decoder circuit 100 on line 26 and input to the burst counter 40. The burst counter 40 outputs a column select signal COL. SEL. on line 130 which is input to the column select circuit 78. The column select circuit 78 shown in FIG. 10 is the same as that shown in FIG. 2. FIG. 10 depicts the path which the column address follows for either writing data to or reading data from the memory array 52 via lines 80 and 82 also shown in FIG. 2. When data is read from the memory array 52, it is output on a read bit true (RBT) line 92 and a read bit complement (RBC) line 90 for sensing by a sense amp 94. As shown in FIG. 10, the burst controller 30 is coupled to directly receive the column address information CAxT from the column address driver 106 simultaneously with the column address predecoder 110 receiving such information. The burst controller 30 remains coupled to the burst counter 40 to generate control signals on line 38 to control the burst counter 40. Rather than receiving the decoded column address information on line 26, the burst controller 30 receives the column address information directly on line 28. According to a further alternative embodiment, the burst controller 30 is coupled to receive the output on line 26 from the column decoder 100 and reencode this output to determine the interleaved direction in the event it is operating in the interleaved mode.

FIG. 11 is a more detailed block diagram of another embodiment of the present invention. This embodiment is similar to that previously described with reference to FIG. 10. In this embodiment, however, the burst controller 30 is coupled to the column address predecoder 110 and receives the first stage predecoded address information on line 22. The burst controller 30 in this embodiment contains an encoder circuit for reestablishing the original column address signal from the predecoded column address information Yx received on line 22. The burst controller 30 outputs signals on line 38 to control the burst counter 40 as explained in more detail herein.

The column address signal 101 is input to the column address input buffer and master latch circuit 104 on individual column address lines 98. This circuit 104 is made of a number of individual buffer and master latch circuits 103 and is equivalent to the column address input buffer 104 of FIG. 10. The outputs of each of the circuits 103 is input to the column address driver circuit 106, which is made of individual driver circuits 105 and corresponds to the column address driver 106 of FIG. 10. The outputs of each of the column address driver circuits 105 is input to the column address predecoder circuit 110, which is made of individual predecoders 107 and is shown in block form as the column address predecoder 110 in FIG. 10. The outputs of each of the individual column address predecoders 107 is input to a column address decoder circuit 100. The circuit 100 includes a plurality of individual column address decoder circuits 109. The outputs from the individual decoders 109 are coupled to a slave latch circuit 111 which includes a plurality of individual slave latches 102. The slave latch circuit 111 is within the burst counter 40 in FIG. 10. Each of the individual slave latch circuits 102 outputs one of the column select signals 130 from the slave latch circuit 111. These individual column select signals 130 therefore correspond to the single column select line 130 of FIGS. 2 and 10. In one embodiment of the present invention, the individual slave latches 102 are grouped in groups of four. In each group of four, each individual slave latch 102 is connected to the adjacent slave latch by lines 112 and the top slave latch is connected to the bottom slave latch by lines 113 as shown by the lines and arrows in FIG. 11.

The output of the column address predecoder circuit 110 is, as previously mentioned, input to the burst controller 30, on lines 22, and the burst controller outputs signals to the slave latch circuit 111 on lines 38 for controlling the selection of the various columns in the memory array block 54 under control of the slave latch circuit even though the address in the input buffer and master latch circuit 104 does not change, as explained in more detail herein.

The circuit shown in FIG. 11 illustrates the circuitry for four individual column address lines 98, the column address 101 as a whole being made up of the individual address lines 98. While only four column address lines 98 are used as shown in FIG. 11, in an alternative embodiment there are sixteen such individual column address lines and the circuitry shown in FIG. 11 is provided four times on the alternative memory device 50 to permit a burst counter 40 of 16 bits. Depending on the number of column addresses controlled by the burst counter 40 (four address pins, as preferred in the circuit herein, or 16 pins), the circuitry is provided and connected as needed. Some memory devices 50 may have only twelve address pins, and any other number of column addresses may be controlled by the burst counter 40.

FIG. 12 is a detailed schematic of one of the column address input buffer and master latch circuits 103 of FIG. 11. The individual input buffer and master latch 103 includes a TTL input buffer 115 of a standard type which outputs the complemented column address input data on line 117 to an inverter 119 on line 121. The column address input data is delayed and presented to a transfer gate 123. The transfer gate 123 is enabled or disabled by the internal clock K on complementary signal lines KINT and KINC. When the transfer gate 123 is enabled, the column address input data is transferred to a master latch 124 having a pair of cross-coupled inverters 126 and 128 for holding the address information. When the internal K clock is high, a transfer gate 125 is enabled to maintain the logic level in the master latch 124. The state of the logic level in the master latch 124 does not change until new address data is positively inserted via transfer gate 123 by the clock K going low. The column address data complement output is provided on a line 131 labeled OUTC. When the clock K is high, the transfer gate 123 is disabled and the transfer gate 125 is enabled to block the change of address information in the master latch 124.

FIG. 13 shows a detailed schematic of one individual column address driver circuit 105 shown in FIG. 11. The complement column address data CAxC is generated on line 137 from the input OUTC on a line 131 by two inverters in series 138 and 135. In addition, the true column address data is output on line 139 as CAxT by being passed through an inverter 141 when a transfer gate 143 is enabled by a complementary pair of signals AOP and AON. The remaining inputs to the column address driver circuit 105 labeled FOFFB and FON provide signals when carrying out certain tests of the memory device 50 and do not relate to the passing of column address signals during normal circuit operation and therefore are not discussed in detail here.

FIG. 14 is a schematic of one example of an individual column address predecoder circuit 107 of FIG. 11. The design and operation of such predecoder circuits 107 are well known in the art and need not be described in detail. The address input data from two different column address driver circuits 105, labeled A1 and A2 in FIG. 14, correspond to CAxT or CAxC for two address bits from two driver circuits 105 shown in FIGS. 11 and 13. These address inputs A1 and A2 are provided to the column address predecoder 107 on lines 137 and 147, respectively. The output of the column address predecoder circuit 107 contains first stage predecoded data on line 151. Preferably, a second set of predecoder circuits are used to predecode other portions of the address input signals (not shown here). Alternatively, the column address decoder circuit 100 may be used instead of one or more column address predecoder circuits 110. However, use of one or two stages of column address predecoders 110 prior to a column address decoder circuit 100 usually simplifies the circuitry required for selecting individual columns.

FIG. 15 is a detailed schematic of an individual column address decoder 109 and a slave latch 102 as shown in FIG. 11 and constructed according to principles of one embodiment of the present invention. A signal YA is input at terminal 150 and a signal YB is input at terminal 152 of the address decoder 109. The signals YA and YB are column address signals which have been output by two column address predecoder circuits 107 shown in FIGS. 11 and 14. The column address decoder 109 is a simple address decoder and takes advantage of having predecoder stages prior to the signal YA on line 150 and YB on line 152 being presented to the address decoder. In alternative embodiments, the column address decoder circuit 109 is a much more complex circuit which performs the complete decoding of the column address information in a single decoding circuit. As will be appreciated, any acceptable decoding circuit could be used in place of the one shown herein.

The column address decoder circuit 109 completes the decoding of the column address signals YA and YB and presents a decoded column address signal on line 154. The decoded column address signal on line 154 is provided to an input of a first storage latch 500. Specifically, the decoded column address signal on line 154 is input to a transfer gate 502. The transfer gate 502 is controlled by a clock K1C and a clock K1T. When the clock K1C goes low and the clock K1T goes high, the transfer gate 502 is enabled. When the transfer gate 502 is enabled, the decoded column address signal on line 154 is output on a line 504. A pair of cross-coupled inverters 506 and 508 operate to store the decoded column address signal on line 504. The stored decoded column address signal is output by the pair of cross-coupled inverters 506 and 508 on line 510, which is the output of the first storage latch 500. After the value of the decoded column address signal is stored on line 510, the transfer gate 502 is disabled so that the state of the decoded column address signal is not changed even if the address inputs YA and YB on lines 150 and 152 are changed.

The decoded column address signal on line 510 is input to a slave latch 160. Specifically, the decoded column address signal on line 510 is input to a transfer gate 158. Upon an address clock skLBAyC going low and an address clock skLBAyT going high, the transfer gate 158 is enabled, which passes the decoded column address signal on line 510 to the input of the slave latch circuit 160 for storing at node 161. After the decoded column address information is stored at node 161, the transfer gate 158 is disabled so that the state of the decoded column address information cannot be changed even if the value of the decoded column address signal on line 510 is changed. A pair of cross-coupled inverters 164 and 168 are connected to the output of the transfer gate 158 at node 161 to store the decoded address signal between transitions of the new address clock skLBAy. A large inverter 170 is coupled to the output of the slave latch circuit 160 at node 166 and drives the column select signal on line 130.

Also coupled to the output at node 166 of the slave latch circuit 160 is a master carry latch 172. The master carry latch 172 is comprised of a transfer gate 162 and a pair of cross-coupled inverters 174 and 176. The output of the master carry latch 172 is a CARRY signal provided on line 112 and is connected to the adjacent slave latches 102 on either side of the slave latch shown, as explained in more detail herein. The transfer gate 162 is enabled and disabled by control of a clock skLCAt and a clock skLCAc. When the clock skLCAt is low, the transfer gate 162 is enabled to provide new carry bit data on line 163 to the cross-coupled inverters 174 and 176. The cross-coupled inverters 174 and 176 store the new carry bit data and place it on the CARRY signal line 112. After the carry information is held on the CARRY line 112, the carry clock skLCAt and its complement skLCAc disable the transfer gate 162 so that the data remains unchanged on the CARRY signal line 112. The carry data is held in this state on line 112 until the transfer gate 162 is again enabled because the master latch circuit 172 holds the CARRY data. As indicated by the dotted lines in FIG. 15, the first storage latch 500, slave latch 160 and master latch circuit 172 are components of each individual slave latch circuit 102 shown in FIG. 11.

The various drive buffers, such as inverters 506, 508, 164, 168, 170, 174 and 176 are made of the appropriate size for driving the circuits to which they are connected. As will be appreciated, the large inverter 170 is a fairly large size because it drives the column selection circuit 78. In one embodiment, the larger inverter 170 has a P-channel transistor with a W/L ratio of 192 and an N-channel transistor of a W/L ratio of 128. Of course, any other size may be used for the large inverter 170 as appropriate for the particular circuit configuration utilized.

Advantageously, the state of the information stored in the slave latch 160 can be changed under control of a clocking circuit other than the address input clocks skLBAyT and skLBAyC. In particular, a clock for driving the slave latch 160 can operate at a much higher rate than the address clock skLBAy and thus provide a new column select line 130 at a faster rate than a new column address can be provided from the transfer gate 158 under control of the column address clock skLBAy as explained in more detail herein.

A carry up signal line CRYUP 114 is coupled to the CARRY signal on line 112 of the next adjacent slave latch 102 below the current slave latch. Further, a carry down signal line CRYDN 120 is coupled to the CARRY line 112 of the next adjacent latch immediately above the instant slave latch 102. Therefore, when a signal is received on the carry up line 114, it is transferred in an upward direction, from the slave latch 102 immediately below. Similarly, when a signal is received on the carry line 120 it is received from the slave latch 102 immediately above so that the signal is being carried down.

The timing for controlling the input of new column select information on either the carry up CRYUP line 114 or the carry down CRYDN line 120 is controlled by a carry up and a carry down clock from the burst controller 30. The carry up clock is connected to signal lines 116 and 118 labeled skUpC and skUpT. These signal lines are connected to a transfer gate 136. Upon the carry up clock being enabled by the burst controller 30, skUpC goes low, which enables transfer gate 136 for placing the decoded column address information signal on line 114 and into node 161. Upon the new decoded column address information being provided to node 161, the state of the data changes at node 166 so that new decoded column address information is stored at node 166 and is output to the column line 130 via the large inverter 170. The inverter 168 is a weak keeper latch, generally made of smaller drive transistors so that the data stored at node 161 may be easily overcome by the positive assertion of new data from the carry up on line 114.

In a similar fashion, decoded address information can be provided on the carry down line CRYDN 120 from the master carry latch 172 in the next adjacent slave latch 102. The carry down line CRYDN 120 is enabled by carry down clocks skDnC and skDnT. When the clock skDnC is low, a transfer gate 132 is enabled to transfer decoded column address information from the master carry latch 172 in the above slave latch 102 into the instant slave latch 102 for storing at node 161.

As will be appreciated, the carry up clock skUp and the carry down clock skDn are not operational at the same time. Rather, either the carry up clock skUp or the carry down clock skDn is enabled depending on the type of interleave pattern under control of the burst controller 30, as explained in more detail herein.

Advantageously, the carry clock skLCA, in both its true and complement form, is clocked while the address clock skLBAy is nonconductive. Similarly, if either the carry up clock skUp or the carry down clock skDn are activated, the address clock skLBAy will not be active so as to avoid contention between the decoded address information which is to be stored in node 161. The burst controller 30 controls these clocks to ensure that there is no contention between these four different clock circuits, as shown and described later herein with respect to FIG. 18. In addition, all clocks are in pulse form to further avoid contention problems. The inverted clocks (e.g., skDnT and skDnC) are matched with each other to avoid feed-through problems.

To ensure proper operation, the carry clock skLCA cannot enable the transfer gate 162 while either the transfer gate 132 or 136 is enabled. The clocks skUp, skDn, and skLCA control these transfer gates such that no two of the transfer gates 132, 136, and 102 are ever simultaneously enabled. The carry clock skLCA enables the transfer of the previous address information on line 166 to the master carry latch 172 while the transfer gates 132 and 136 are disabled. Once the transfer gate 162 is disabled, either transfer gate 132 or 136 can be enabled, depending on the mode of operation for the burst counter 40.

An alternative embodiment of a column address decoder 109 and a slave latch 102 constructed in accordance with the principles of the present invention is shown in FIG. 16. The embodiment shown in FIG. 16 is different from that of FIG. 15 by the inclusion of a second storage latch 512. This second storage latch 512 is positioned between the first storage latch 500 and the slave latch circuit 160. The decoded column address signal on line 510 is input to the second storage latch 512. Specifically, the decoded column address signal on line 510 is input to a transfer gate 514. The transfer gate 514 is controlled by a clock K2C and a clock K2T. When the clock K2T goes low and the clock K2C goes high, the transfer gate 514 is enabled. When the transfer gate 514 is enabled, the decoded column address signal on line 510 is output on a line 516. A pair of cross-coupled inverters 518 and 520 operate to store the decoded column address signal on line 516. The stored decoded column address signal is output by the pair of cross-coupled inverters 518 and 520 on line 522, which is the output of the second storage latch 512. After the value of the decoded column address signal is stored on line 522, the transfer gate 514 is disabled so that the state of the decoded column address signal is not changed even if the value of the decoded column address signal on line 510 changes.

Operation of the slave latch circuit 160, the master latch circuit 172, and the transfer gates 132 and 136 is the same as that described with reference to the circuit of FIG. 15. The inclusion of the second storage latch 512 may simplify the timing of the clock signals K1, K2, skLCA, skUp, skDn, and skLBA which control the operation of the slave latch circuit 102.

FIG. 17 illustrates another alternative embodiment of the column address decoder circuit 109 and slave latch circuit 102 which achieves advantages similar to the circuits of FIGS. 15 and 16 without the addition of the storage latch 500 or the storage latch 512. In this embodiment, the decoded column address on line 154 is input directly into the transfer gate 158 of the slave latch 160. During a current burst count sequence, a new column address is presented to the column address terminals 98 (see FIG. 11). This new column address is propagated through the column address decoder circuitry including column address decoder 100 and output on line 154. However, this next decoded column address on line 154 is not latched into the slave latches 160 of the slave latch 102 nor into the burst controller 30 while the current burst count sequence is executing. However, the time required for address information to propagate through the various stages of the column address decoder circuits for presentation to the slave latch 102 is completed while the current burst count sequence is being carried out under the direction of the burst controller 30. Immediately upon completion of the current burst count sequence, the clock skLBAy controlling the transfer gate 158 enables the transfer gate to transfer the new decoded column address into the slave latch circuits 160 in the slave latch 102 so the burst counter 40 can commence the next burst count sequence.

In this alternative embodiment, the clock skLBAy which controls the transfer gate 158 is a different clock than the clock which controls the input of data from input pins 98 into the column and word decoder circuitry. These separate clocks enable the column and word decoder circuitry to advance the new address to a critical point just prior to selection of the memory cells in the memory array 54 where it is held in a latch until the burst counter cycle has been completed and then the new address is immediately moved into the burst counter 40 so that subsequent accessing of the memory cells can occur on a much faster time cycle than would otherwise be possible if the new address were not loaded until after the burst sequence were completed. In this embodiment of the present invention, the burst sequence being controlled by a separate clock permits multiple addresses to be accessed very rapidly while at the same time new address data is presented for accessing so the access time for all memory cells to the array is performed just as fast as the burst access time.

FIG. 18 illustrates four interconnected pairs of column address decoders 109 and slave latches 102. Each pair is designated a counter bit circuit 302. The input terminals 104 and 108 shown correspond to those terminals shown in FIGS. 15, 16, and 17 with respect to the column address decoder 109 and the slave latch 102. Within each counter bit circuit 302, there is an address decoder 109 and a slave latch 102. The four counter bit circuits 302 interconnected as shown form the burst counter 40. As will be appreciated, in some designs the address decoder 109 is in a separate block and may in fact be in a different location on the memory device 50. For convenience's sake, they are shown in a single counter bit circuit 302. Preferably, the slave latch 102 is located as close to the column select signal 130 as possible, even though the address decoder 109 may be located much closer to the address input pins on the memory device 50. In a preferred embodiment, the address decoder 109 and the slave latch 102 are located close together, both of them being positioned close to the column select circuit 78 to directly drive the column select signals 130 in as short a time as possible. In an alternative embodiment, the slave latch 102 is located in the same position (immediately adjacent the column select line 130), but the address decoder 109 is located spaced apart, in a different location on the memory device 50.

Since the counter bit circuits 302 include both the decoder 109 circuitry and the slave latch circuitry 102, address information, address clock signals, and burst clock signals are input to each counter bit circuit. These inputs are provided on terminals YA, YB, skLBAy, skLCA, skUp, and skDn of each counter bit circuit 302. As shown in FIG. 18, predecoded column address information is provided on a group of lines 104 from two column address predecoders 107. This predecoded address information on lines 104 is provided to each of the counter bit circuits 302. As will be appreciated, there are four sets of the groupings of four counter bit circuits 302 making in total 16 counter bit circuits 302 for providing sixteen column select signals 130 to drive each of the sixteen column selection signals associated with each memory block 54. The signals for the address control clock skLBAy, as well as the burst counter carry clock skLCA, carry up clock skUp, and carry down clock skDn are input on lines 108 to each of the counter bit circuits 302.

As can be seen by viewing the connections of FIG. 18, each CARRY line from each counter bit circuit 302 is coupled to the CRYUP and CRYDN lines of next adjacent above and below counter bit circuits 302. This provides the decoded address information to the adjacent counter bit circuit 302 so that either a count up or count down pattern may be followed. The CARRY signal from the top counter bit circuit 302 wraps around to the CRYUP signal of bottom counter circuit 302 for performing the carry up operation. The CARRY signal from the bottom counter circuit 302 wraps around to the CRYDN signal of the top counter circuit 302 for performing a carry down operation, as can be seen by viewing the figures.

In the embodiment of the burst counter circuit 40 shown in FIG. 18, two predecoded column address bits (i.e., YA and YB) are used so that four column burst addresses are obtainable. In an alternative embodiment, sixteen column burst addresses are obtained using four predecoded column address bits. Given the circuitry of this invention, the same features could be used to provide a five-bit counter circuit providing thirty-two column burst addresses, and so on.

FIG. 19 is a detailed block diagram of one embodiment of slave latch circuits 102 interconnected to form a burst counter circuit 40 according to principles of the present invention. Notice that in this embodiment, each slave latch circuit 102 includes a master latch 404 not contained in the previous embodiments of the slave latch circuit shown in FIGS. 11 and 15–17. A data input terminal 401 is coupled to each master latch 404. The clocking sequence of the master latches 404 is determined by a clock K on lines 406. Each of the master latches 404 is controlled by the same clock K. The output of each master latch 404 is provided on an output terminal 407 and input to a storage latch 409. The clocking sequence of the storage latches 409 is determined by a clock K1 on lines 411. An output 408 of data stored in the storage latch 409 is provided on lines 408 to a slave latch 410. The input of data on lines 408 to the slave latches 410 is controlled by a clock sk on terminals 412. The output of each slave latch 410 is provided on an output terminal 414 to a second master latch 416. The input of data to each second master latch 416 is controlled by a clock skLCA on terminals 418. The output of each second master latch 416 is provided on a terminal 420. All the second master latches 416 are controlled by the same clock skLCA for inputting data into each individual second master latch.

The input of data from the second master latch 416 to one of the adjacent slave latches 410 occurs under control of two separate clocks, either clock skDn or clock skUp. The clock skDn is provided to the slave latch 410 on a terminal 422 and functions to clock data from the second master latch 416 directly above the slave latch so the data is shifted in a down direction. The clock skUp is provided to the slave latch 410 on a terminal 424 and functions to clock data from the next adjacent below second master latch 416 directly below the slave latch so the data moves in an upward direction. The four slave latches labeled 410 can be analogized to be organized in a vertical column. Data can be moved in a vertical direction downward or upward along the vertical column of slave latches 410. In addition, it can also be moved in a horizontal direction from the slave latch 410 to a second master latch 416 along the same horizontal data line. The output of the slave latch 410 is also provided on an output terminal 415 which corresponds to one of the column select signals 130 (see FIG. 11) provided to the column select circuit 78. The master latch 404, storage latch 409, slave latch 410, and master latch 416 together form one embodiment of the slave latch circuit 102.

The output 420 of the second master latch 416 is provided as feedback to another slave latch 410 which is in the same level as the slave latch from which it received its information. This will now be explained. Each of the slave latches 410 can be viewed as being part of two data transfer directions. The first data transfer direction can be analogized to a horizontal transfer of data from the master latch 404 in a forward or horizontal direction to the storage latch 409. The data in the storage latch 409 is further shifted in a horizontal transfer to the slave latch 410. The data is then transferred under control of a different clock (skLCA) to a further horizontal level, namely, the second master latch 416. There is thus a chain of four horizontal stages. The first stage is from the input terminal 401 to the first master latch 404 under control of the clock K. The second stage is from the output 407 at the first master latch 404 to the storage latch 409 under control of the clock K1. The third stage is from the output 408 of the storage latch 409 to the slave latch 410 under control of the clock sk. The fourth stage is a transfer from the slave latch 410 to the second master latch 416 under control of the clock skLCA.

The circuitry of FIG. 19 can be analogized to be organized in a vertical column of the slave latches 410 and a horizontal row of latches comprising the first master latch 404, storage latch 409, slave latch 410, and second master latch 416. Data is transferred vertically from one second master latch 416 to the slave latch 410 that is in the same vertical column as the slave latch from which the second master latch received the data.

The operation of the circuitry of FIG. 19 will now be explained. Decoded column address data is provided at a first stage on the input terminals 401. Under control of the clock K, this data is transferred from the input terminals 401 to the first master latches 404. The decoded column address data in the master latches 404 is provided on the outputs 407 to the storage latches 409. Under control of the clock K1, this data is transferred from the outputs 407 to the storage latches 409. At this point, the first master latch 404 is free to store the next decoded column address on the input terminals 401. Transfer of the decoded column address data from the output terminal 408 into the slave latch 410 is controlled by the clock sk which is provided on terminal 412 to each of the slave latches. This data is held in the slave latch 410 as long as needed for purposes of circuit operation. In addition, the decoded column address data is provided out of the slave latch 410 on the output line 415 for providing the data to a logic circuit (not shown).

The data at output 414 of the slave latch 410 is also made available to the second master latch 416. Under control of clock skLCA data is clocked into the second master latch 416 from the slave latch 410. During operation, the clock skLCA occurs after the clock sk. Therefore, the decoded column address data which was previously held in the slave latch 410 and output to the logic circuit on output line 415 is transferred to the second master latch 416. This data is stored in each of the second master latches 416 on the same clock skLCA. After data is stored in the second master latch 416, one of the vertical transfer clocks, either skDn or skUp, transitions to transfer the data stored on the previous clock into the slave latch 410 which is either vertically up or vertically down within the vertical column of slave latches.

The decoded column address data in each of the second latches 416 remains unchanged so that the data now stored in the slave latch 410 is the current data which is being provided on output line 415. The data from the previous cycle is now stored in the second master latch 416. After some time, the master clock skLCA is pulsed to transfer the data into the second master latch 416 after which one of the vertical clocks, either skDn or skUp is pulsed to transfer the data from the previous slave cycle, now stored in the second master latch, into another slave latch 410 within the same vertical column. Decoded column address data from the previous cycle is therefore rotated either up or down the vertical column of slave latches 410.

While only three clocks are shown for the slave latch 410, in one embodiment, additional clocks are provided for the slave latch 410 and additional feedback paths are provided from the second master latch 416 to additional of the slave latches besides only the slave latches immediately adjacent any of the up or down vertical direction. Using additional clocks or additional connections permits the data to be selectively transferred from any second master latch 416 in the fourth horizontal level to any slave latch 410 in the third horizontal level. In addition, one skilled in the art will realize that if the three clock signals sk, skDn, and skUp are controlled properly, the decoded column address data on the output 407 may be input directly to the slave latch 410. This would correspond to using the slave latch circuit 102 of FIG. 17 with the inclusion of the master latch 404 in each of the slave latch circuits. If the timing of the clock signals sk, skDn, and skUp is properly controlled, data contention can be avoided and a pipeline for the decoded column address data on the output terminals 407 of the master latch 404 can be established. Such a pipeline would mean that the slave latch 410 would store the current decoded column address data and the master latch 404 would be free to store the next decoded column address data from the input terminal 401 under control of the clock K. This approach may be limited due to the overhead required to avoid data contention. The insertion of the storage latch 409 in the slave latch circuit 102 helps alleviate such data contention concerns.

FIG. 20 illustrates another embodiment of a burst counter circuit 40 in accordance with the present invention. A data input terminal 401 is coupled to a master latch 404. The clocking sequence of the master latch 404 is determined by a clock K on a line 406. Each of the master latches 404 is controlled by the same clock K. The output of the master latch 404 is provided on an output terminal 407 and input to a storage latch 409. The clocking sequence of the storage latch 409 is determined by a clock K1 on line 411. The storage latch 409 provides an output 413 of the data stored in the storage latch. The output 413 is coupled to a second storage latch 415. The clocking sequence of the second storage latch 415 is determined by a clock K2 on line 417. The second storage latch 415 provides an output 408 of the data stored in the second storage latch. The output 408 is coupled to the slave latch 410. The input of data on the output 408 to the slave latch 410 is controlled by a clock sk on terminal 412. The output of the slave latch 410 is provided on an output terminal 414 to a second master latch 416. The input of data to the second master latch 416 is controlled by a clock skLCA on a terminal 418. The output of the second master latch 416 is provided on a terminal 420. All second master latches 416 are controlled by the same clock skLCA for inputting data into each individual second master latch. The input of data from the second master latch 416 to one of the adjacent slave latches 410 occurs under control of two separate clocks, skDn and skUp. In this embodiment, the latches 404, 409, 415, 410 and 416 together compose one embodiment of the slave latch circuit 102.

Operation of the circuitry of FIG. 20 is similar to that of the circuit illustrated in FIG. 19. Decoded column address data is held at a first stage on the input terminal 401. Under control of the clock K, data is transferred from the input terminal 401 to the first master latch 404. The data in the master latch 404 is provided on the output 407 to the storage latch 409. Under control of the clock K1, this data is transferred from the output 407 to the storage latch 409. At this point, the first master latch 404 is free to store the next decoded column address on the input terminals 401. The decoded column address data stored in the storage latch 409 is provided on the output 413. Under control of the clock K2, this data is transferred from the output 413 to the second storage latch 415. At this point, the first storage latch is free to store the next decoded column address on the output 407 of the first master latch 404. The decoded column address data stored in the second storage latch 415 is provided on output 408 to the slave latch 410. The decoded column address data on the output 408 is stored in the slave latch 410 under control of the clock sk on line 412. This decoded column address data is held in the slave latch 410 as long as needed for purposes of circuit operation. In addition, the decoded column address data is provided out of the slave latch 410 on the output 415 to a logic circuit (not shown).

The remainder of the operation of the circuit of FIG. 20 is the same as that described above with reference to FIG. 19. The difference between the embodiment of FIG. 19 and that of FIG. 20 is that, in the latter, the second storage latch 415 is included between the first storage latch 409 and the slave latch 410. By adding the second storage latch 415, the timing of the clocks K, K1, K2, sk, skDn, skUp, and skLCA may be simplified.

In the embodiments of FIGS. 19 and 20, the clocks sk, skDn, and skUp do not operate at the same time and preferably are timed to be assured of operating one clock only when the other clock is disabled. The clock K can be clocked to provide data in a synchronous pattern to the slave latches. In an alternative embodiment, the clock K is strobed only as needed to provide new data and is disabled while clocks sk, skDn, and skUp are operational in conjunction with clock skLCA. The clock sk is the same clock as skLBAy in one embodiment and in a different embodiment is a different clock on a different timing pattern. The data can be any type of data. For example, it can be column or word address data, data for storage in a memory array, data in, information data, pointer data, register tracking data or any other data.

As will be appreciated, the embodiments of the present invention shown in FIGS. 19 and 20 provide the advantage of shifting data through horizontal stages and also permitting the shift of data vertically in a column. By selectively strobing the clocks, the circuits of FIGS. 19 and 20 can operate as a shift register which shifts the data in a rotational pattern from one slave master stage to another. Alternatively, it can be operated as a counter and being provided in any start counter and counting either up, down, or in some other pattern as controlled by the clocks. A number of other logic functions can be performed by the circuits of FIGS. 19 and 20. While only four stages are shown in the horizontal shift direction and four stages are shown in the vertical column of slave latches 410, in alternative embodiments the vertical column is comprised of 16 slave latches while the horizontal column remains in four stages. The data can therefore be shifted among 16 slave stages in a vertical direction or provide a 16 bit counter which can be loaded at any desirable start count position.

A primary advantage of the burst counter 40 in accordance with the present invention is best understood with reference to FIGS. 11 and 19. When the burst counter 40 of the present invention is used in the memory device 50, a new column address 101 may be input into the memory device 50 at the terminals 98 while the burst counter 40 is accessing different memory locations associated with a decoded column address stored in the burst counter. While the burst counter 40 is controlling the access to locations in the memory array 54 via the column select lines 130, a new column address at the terminals 98 is loaded into the buffer and master latch circuit 104 and propagated through the column address decoder circuitry (driver circuit 106, predecoder circuit 110, and decoder circuit 100). At this point, a new decoded column address is latched by the latches 404 and held in a waiting state while the burst counter 40 is outputting the column select signals on lines 130. These column select signals on lines 130 access locations on the memory array 54 which are associated with the current decoded column address stored in the slave latches 410. In a preferred embodiment, the burst counter 40 accesses the location associated with the original decoded column address received from the storage latch 409 plus three other locations. Each access of a location is known as a burst count cycle, and the accessing of all four locations is known as a burst count sequence.

Separate clocks are provided for burst counter 40 (sk, skDn, skUp, skLCA) and for moving a new decoded column address into the storage latch 409 (K1). This allows the burst counter 40 to begin accessing the first location associated with a new decoded column address within a burst count cycle. In this way, once an initial random decoded column address from the storage latch 409 is stored in the burst counter 40 (i.e., in the slave latch 410), all subsequent random decoded column addresses and their associated locations are accessed within a burst count cycle.

In one embodiment of the row address circuit 105, a plurality of respective storage latches are contained in the last stage of the address decoder 107 with an output of each storage latch being coupled to an associated MWL terminal of an associated local wordline driver circuit 112. This can be done in a manner similar to that shown for the column decode circuitry or other acceptable techniques. These storage latches store the fully decoded values of main word line signals which are provided on the MWL terminals. The values stored in the storage latches are determined by the address input by the user or computer system at the input pins and decoded by the address decoder 107.

In operation, while data associated with the initial random address is being read out, a subsequent address at any random location is input by a user and decoded. The column portion of the subsequent random address has its column address portion decoded by the address decoder 107 and the column address decode circuitry as illustrated in FIG. 2. The row address portion of the subsequent random address is decoded by the address decoder 107 and the values of the main word line signals associated with this row address are stored in the associated storage latches. Once the data associated with the initial random address has been read out, the data stored in the storage latches is output to the MWL terminals to thereby activate the word line associated with the subsequent address. The burst counter 40 then begins accessing the columns associated with the subsequent address to read out the subsequent data. In this way, a fully random address with new row and column portions of the address are provided while data is being read out to allow access to subsequent random addresses at a very rapid rate and thereby provide data out of the memory device 50 continuously at a higher burst count rate.

Another advantage of the present invention is that the length of a burst count cycle can be made considerably shorter than the time required for address data to travel down the data path and be decoded for a majority of the chip access times. A further advantage is that a memory controller or microprocessor has a large time window in which to provide the new address data to the memory device 50 containing a burst counter 40 in accordance to the present invention. To fully appreciate this advantage, consider the following prior art sequence of operation. In the prior art, a microprocessor sends instructions to access the memory device 50. The access can be either to write data to or retrieve data from the memory device 50. However, if the memory device 50 is currently accessing memory cells, it is in a busy state and the microprocessor cannot present the new address data or other information to the memory device. The microprocessor must then wait until the memory device 50 is available to provide the new instructions. If the memory device 50 is currently executing a burst count sequence, the microprocessor effectively has to wait in order to decode and handle the new random address request. This places the main controlling chip, the microprocessor, into a waiting mode.

With this invention, the microprocessor has the option of sending multiple address requests rather quickly to the memory device 50. Assuming the first address request is for burst mode, the memory device 50 begins to access these multiple data locations on a timed sequence. This creates a window of time during which the memory device 50 is accessed under the control of the internal burst counter 40 and not under control of the microprocessor. During this window of time, the microprocessor is free to perform a number of other functions while waiting for the memory device 50 to become available again. With the present invention, the microprocessor can provide a new address at any convenient time within that time interval. The microprocessor is not tied to having to provide the new address on any particular timing sequence in order to be assured of the maximum possible access speed. Instead, if the microprocessor provides the new address at any time within the large window while the burst count sequence is being carried out in the memory device 50, the address data is transmitted through the address decoder circuitry and loaded into the latch (storage latch 409 or storage latch 415) just prior to the final selection stage so that as soon as the current burst count sequence is completed, a new burst count sequence can be started under the same timing. This is particularly advantageous in those situations where there is a memory controller which provides the address and timing sequence under the instructions of a master microprocessor.

A further alternative embodiment is shown in FIGS. 9A and 9B. FIG. 9A is a block diagram of a memory device 50 which will be used to describe the pipelined operation of one embodiment of the burst counter of the present invention. The memory device 50 is shown as including four memory blocks 700 each comprising a plurality of rows and columns of memory cells which store data. Each memory cell has a unique address associated with that memory cell. An input register and predecoder circuit 702 receives a row address and provides a decoded row address to a master row decoder and driver circuit 704. The input register and predecoder circuit 702 typically includes registers which are in the form of master-slave flip-flops with a first clock signal clock 1 controlling the operation of these registers. The master row decoder and driver circuit 704 in combination with local row decoder and driver circuits 706 decode the row address and select a row within one of the blocks 700 which contains the addressed memory cells.

During the row address decoding and row selection process, the selection of the block and column containing the addressed memory cells data is performed in parallel with the row selection process. Specifically, an input register and decoder circuit 708 receives a column and block address and under control of the clock signal clock 1, decodes the column and block addresses, and provides decoded column and block addresses to a column and block select circuit 710. The column and block select circuit 710 determines which block 700 contains the addressed data memory cells and provides a block enable signal to that block. In this embodiment, the column and block select circuit 710 generates thirty two column select signals which select the addressed memory cells in the selected block and row. In response to the column select signals, a sense amplifier and storage register circuit 712 senses the data from the addressed memory cells and stores that data in respective storage registers. The sense amplifier and storage register circuit 712 also operates under control of the clock signal clock 1.

A burst counter circuit 714 generates data select signals so that data stored in the storage registers is burst counted out of the storage registers under control of a clock signal clock 2, which has a higher frequency than the clock signal clock 1. A data input/output circuit 716 receives the burst out data from the storage registers of the sense amplifier and storage register circuit 712 and provides that data on a data bus coupled to the memory device 50.

FIG. 9B is a more detailed block diagram of one of the blocks 700 and the operation of one I/O group within that block. In this embodiment of the block 700, the block includes 128 columns of memory cells with these 128 columns being divided into eight I/O groups designated I/O0–I/O7. When a row in the block 700 is selected, each memory cell in that row provides its data on associated bit lines as known in the art. Thus, in this embodiment, 128 cells in the selected row provide their data on associated bit lines. Each I/O group has 16 bit line pairs and within each I/O group four column select signals from the circuit 710 cause circuit 712 to sense in parallel the data in four addressed memory cells. Each of the sensed bits of data is stored in a respective storage register in the circuit 712. Under control of the faster second clock signal clock 2, the burst counter 714 controls the storage registers so that the contents of the respective registers are transferred to the data input and output circuit 716 in a burst fashion.

FIGS. 9A and 9B illustrate how the present invention provides access to data at any random data storage location within the memory device 50 at the faster burst count rate under control of the clock signal clock 2 according to one alternative embodiment. With the present invention, each read cycle of the memory device 50 is divided into two parts. The first part of the read cycle is the accessing of the addressed memory cells and the storage of the data contained in those cells in the storage registers of the sense amplifier and storage register circuit 112. The second part of the read cycle is the burst output of this data stored in the storage registers of the sense amplifier and storage register circuit 712. With the present invention, the first part of the second read cycle occurs in parallel with the second part of the first read cycle to thereby provide pipeline operation of the memory device 50. In other words, data stored in the storage registers of the sense amplifier and storage register circuit 712 during a first read cycle is burst out under control of the burst counter 714 while new address data is provided to the memory device 50 and decoded by the various circuits within the memory device. Once the data stored in the registers in circuit 712 has been burst out of the memory device 50, data from the next read cycle is immediately transferred into the storage registers to be subsequently read out of the memory device 50. Thus, while data is burst counted out of the memory device 50 at the rate defined by the second clock signal clock 2, access at another random data storage location within the memory device 50 is occurring in parallel with that data being burst counted out of the memory device. In this embodiment, it should be noted that the burst counter circuit 714 provides a burst count to the storage register in the circuit 712 and does not supply the column select signals as in other embodiments of the burst counter previously described.

FIG. 21 is a schematic of one embodiment of the burst controller 30, shown in FIGS. 10 and 11. The burst controller 30 is shown as providing signals skLBAy, skLCA, skUP, and skDn. One skilled in the art will realize the burst controller 30 also provides the signals K, K1, and K2 in various embodiments of the present invention. Although not shown, the circuitry required to generate these signals is known in the art and one of ordinary skill in the art would be able to use such known circuits in combination with the present invention described herein to practice the invention. The burst RAM memory device 50 according to the present invention has the ability to control the direction of counting up or counting down. It also has the ability to sense whether the counting should proceed in an up direction or a down direction based on the state of the address input. It thus can operate in either an interleaved mode or in a linear mode. If the count is to proceed in an upward fashion, then complementary clocks skUpT and skUpC must conduct in the proper timing sequence. If the count is to proceed in a downward direction, then complementary clocks skDnT and skDnC are enabled. The signals CRYUP and CRYDN come from the CARRY signal in the counter circuit 302 below and from the CARRY signal in the counter circuit 302 above, respectively. The burst controller 30 determines the direction of the count and activates either the up or down counter clocks, but not both.

As shown in FIG. 21, the burst controller 30 includes an address encoder circuit 310, which in this embodiment includes a NOR gate 312. The NOR gate 312 receives the predecoded address information on lines 104. In the embodiment shown, the burst controller 30 receives the least significant address bit from each address, although in alternative embodiments it may receive the most significant bit or other bits to be decoded for controlling the direction of the count. However, according to a preferred embodiment of the present invention, the state of the least significant bit is used to control whether the clock proceeds in an up fashion or a down fashion, as will now be explained.

The NOR gate 312 encodes the predecoded address signals on lines 104 to once again obtain the least significant bit A0 at a node 314. This least significant bit information is transferred to a node 316 via an inverter 318. Upon clocking of the new address clock on line 36, a transfer gate 320 conducts to place the least significant bit column address into a latch 322 and stored at a node 324. The latch 322 is composed of an inverter 326 and an inverter 328.

The least significant address bit is then stored at a node 325 for controlling the operation of the burst counter 40 for selective modes of operation during subsequent count steps.

The output of the latch 322 is provided to one input of a NAND gate 330. The other input to the NAND gate is on line 32 which is a CMODE signal for indicating whether the burst controller 30 will force a count in the up direction or in the down direction. The CMODE signal on line 32 is derived from a pin LBO which is shown and described in more detail later herein. If the signal CMODE is low, then the output of NAND gate 330 is forced high. Forcing the output of NAND gate 330 high at node 334 forces the burst counter 48 to always count in the up direction. This enables the carry upclocks skUPC and skUpC so that each incremented count is in the upward direction. It also disables the carry down clocks skDnT and skDnC so that counting in the downward direction cannot occur.

A linear mode of operation has been designated as the preferred mode for certain types of processors, such as the power PC, the Cyrix M1, many Motorola products, as well as RISC processors. The burst counter 40 therefore can be placed in a linear burst mode by a control of the CMODE signal on line 32. Shown below in Table 1 is the sequence for the burst counter 40 if the linear mode is selected.

TABLE 1

Linear Burst Sequence (LBO = GND)

| BURST STARTING ADDRESS: | | BEGIN 1 | | BEGIN 2 | | BEGIN 3 | | BEGIN 4 | |
|---|---|---|---|---|---|---|---|---|---|
| | | A1 | A0 | A1 | A0 | A1 | A0 | A1 | A0 |
| Load External Address | A14-A2 | 0 | 0 | 0 | 1 | 1 | 0 | 1 | 1 |
| 1st Burst Address (Internal) | A14-A2 | 0 | 1 | 1 | 0 | 1 | 1 | 0 | 0 |
| 2nd Burst Address) (Internal) | A14-A2 | 1 | 0 | 1 | 1 | 0 | 0 | 0 | 1 |
| 3rd Burst Address) (Internal) | A14-A2 | 1 | 1 | 0 | 0 | 0 | 1 | 1 | 0 |

Note: The burst count sequence wraps around to the initial address after a full count is completed.

As can be seen by referring to the Table 1 above, the linear mode causes the address to be incremented in an up count fashion, regardless of the beginning state. The user thus is able to selectively control whether the burst address is output in an interleave fashion or in a linear fashion by control of the state of the linear burst sequence pin $\overline{LBO}$ ($\overline{LBO}$=GND for linear mode).

On the other hand, some microprocessors on the market specify that the burst mode sequence is to be in an interleave mode. Microprocessors in this group include Intel products such as the Pentium, the i486 and other Intel products. If the CMODE signal is in the high state on line 32, the burst counter 40 counts in the interleave mode. Counting in an interleave mode is one significant advantage of the present invention in which the state of the least significant address bit A0 is stored at node 325 and controls the direction of the count whether up or down as will now be explained.

Table 2, printed below, shows the sequence for the burst counter 40 if the interleaved mode is selected. In this embodiment, the interleave burst sequence is enabled by holding the state of the linear burst sequence pin $\overline{LBO}$ in the high state (i.e., the signal on line 32 is high). Referring now to Table 2:

TABLE 2

Interleave Burst Sequence (LBO = VCC)

| BURST STARTING ADDRESS: | | BEGIN 1 | | BEGIN 2 | | BEGIN 3 | | BEGIN 4 | |
|---|---|---|---|---|---|---|---|---|---|
| | | A1 | A0 | A1 | A0 | A1 | A0 | A1 | A0 |
| Load External Address | A14-A2 | 0 | 0 | 0 | 1 | 1 | 0 | 1 | 1 |
| 1st Burst Address (Internal) | A14-A2 | 0 | 1 | 0 | 0 | 1 | 1 | 1 | 0 |
| 2nd Burst Address (Internal) | A14-A2 | 1 | 0 | 1 | 1 | 0 | 0 | 0 | 1 |
| 3rd Burst Address (Internal) | A14-A2 | 1 | 1 | 1 | 0 | 0 | 1 | 0 | 0 |

Note: The burst count sequence wraps around to the initial address after a full count is completed.

As shown in Table 2, when the interleave mode is selected, the external addresses A0–A14 are input to the address input buffer 10. The signals A2–A14 are decoded in a manner which has been explained for selection of memory array blocks and other address information. The least significant 2 bits are also decoded and provided to the column selection circuit 78. In addition, the least significant bit, A0, is encoded and stored at node 325 as has been explained with reference to FIG. 21. When a burst sequence begins, the columns are selected in the sequence shown in Table 2. Namely, for a beginning address of the least two significant bits being both 0, according to the interleave pattern, a count up is performed of the last two bits to access the columns that correspond to the addresses indicated by each new group of addresses A0–A14 on each burst cycle. On the other hand, if the least significant bit begins as a 1 as shown in the column labeled Begin 2, then, according to the interleave pattern, the address is incremented down so that the appropriate column select signals are generated. The effective address signals for the other potential beginning addresses for the least two significant bits are shown as Begin 3 and Begin 4 in Table 2.

As shown in FIG. 21, if the address of the least significant bit A0 is a 1 so that the input at node 325 of the NAND gate 330 is a high, then the burst counter 40 will force a count in the down direction. Namely, the output of the NAND gate 330 is forced low which enables the carry down clock skDn in order to count down and disables the carry up clock skUp. Similarly, if the bit stored at node 325 is low, corresponding to the least significant address bit A0 being low, then the output of the NAND gate 330 is high, which forces the burst counter 40 to count in an up direction. Thus, in the interleave mode, the state of the least significant address bit A0, whether 0 or 1, controls whether the burst counter 40 counts up or down. As will be appreciated, the circuitry for generating the carry up clock skUp comprises a pair of NAND gates 336 and 338. The circuitry for generating the carry down clock skDn comprises a pair of NAND gates 340 and 342. The enabling of the clock signals skUp and skDn is controlled by the burst carry clock skLCA on line 34 which provides inputs to the NAND gates 336, 338, 340, and 342 for the generation of the respective carry up clocks and carry down clocks, depending on which is enabled by the NAND gate 330.

As will be appreciated, the carry clock skLCA, being controlled by an external pin ADV, is able to directly access columns in the memory even though the address provided at the address input pins does not change. The burst controller 30 can cause the change in the respective column-select lines within the counter circuits 302 to directly drive the column select circuit 78 as shown in FIG. 21 at a much faster rate than could be controlled from an outside address. Further, since the decoded address signal on lines 104 has been stored at the node 325, it is not necessary to decode each incremented address. Rather, the already decoded address information is incremented in a pattern which simulates the incrementing of the least two significant bits in the address as if it had been provided, even though the address does not change.

As will be appreciated, in a preferred embodiment of the invention, the burst counter 40 is fully operational both during write cycles and during read cycles. Therefore, data can be written to the memory array 52 using a burst write cycle under control of the burst counter 40 as controlled by the burst controller 30. Similarly, data can be read very quickly from the memory array 52 under the control of the burst counter 40 by initiating the burst counter during a read cycle and accessing sequential memory locations.

FIG. 22 is a schematic diagram of one embodiment of the column select circuit 78 shown in FIGS. 2 and 10. One set of circuitry is shown for a single pair of BLT 82 and BLC lines 80, it being understood that similar circuitry is included for the remaining 15 pairs of BLT and BLC lines. As shown, the column select circuit 78 includes a pair of active load transistors 268 and 270 that, when activated, couple the associated BLT and BLC lines 82 and 80 to the power-supply voltage VCC via a power-supply terminal 272. An equilibrate transistor 274 is coupled between the BLT and BLC lines 82 and 80. A pair of read passgates, here transistors 138 and 134 are coupled between the BLT and BLC lines 82 and 80 and a pair of RBT 90 and RBC 92 lines, respectively. A pair of write passgates 142 and 144 couple the BLT and BLC lines 82 and 80 to a WBT line 76 and a WBC line 74. A column select circuit 284, which includes a NAND gate 136 and an inverter 140, receives a signal ISO via a terminal 132 and a column line signal on line 130 from the column select bus that is associated with the corresponding pair of BLT and BLC lines. For example, in one aspect of the invention, Y=15, which means there are 16 BLT/BLC line pairs that can be coupled to the WBT and WBC lines 76 and 74. In this case, the circuit shown in FIG. 3 is replicated 16 times, one column select circuit 78 for each BLT/BLC pair. Each of these 16 replicated column select circuits 78 is coupled to a different one of the 16 lines that form the column select bus. Thus, when a particular memory cell is to be either read from or written to, the column select circuit 78 associated with the corresponding BLT/BLC line pair has its column select line carry an active signal to couple the BLT and BLC lines to the appropriate read or write lines as is further discussed below.

The column select circuit 78 is used for both writing data to and reading data from the memory array blocks 54. The column select circuit 78 therefore includes the input signals WBT 76 and WBC 74 for providing data on bit lines BLT 82 and BLC 80 under control of the ISO signal on line 130 and the column select signal on line 132. As will be appreciated, when data is being written to the memory array 52 the data true is provided on signal line WBT 76 and the data complement is provided on signal line WBC 74. While the data is present on the data bus lines, the signals BLC and a signal BLEQ are held high while the signal COL 130 and ISO 132 are held high. The output of the NAND gate 136 is low to turn on the read control transistors 138 and 134 and the output of the inverter 140 is high to turn on the write access transistors 142 and 144. Data is thus passed from the WBT signal on line 76 to the BLT signal on line 82 and from the WBC signal on line 74 to the BLC signal on line 80 so that data is on the column lines for storing in each individual memory cell.

In operation, during a read or a write cycle, the a $\overline{BLL}$ signal goes active low to pull up the BLT and BLC lines to approximately VCC. Prior to either a read or a write cycle, the $\overline{BLEQ}$ signal goes active low to equilibrate the associated BLT and BLC lines. The $\overline{BLEQ}$ signal then goes inactive high before the $\overline{BLL}$ signal goes active low. Also during a read or a write cycle, both the ISO signal on line 132 and the column select signal COL on line 130 go active high to activate and thus close both the read passgates 134 and 138 and the write passgates 142 and 144. Such a circuit structure eliminates the need for separate passgates for the sense amplifier 94 (FIG. 2) that is coupled to the RBT and RBC lines 90 and 92. During a write cycle, the ISO signal on line 132 remains active high during the entire write cycle. The ISO signal on line 132 remains active high only for an initial period of a read cycle and then goes inactive low disabling, (i.e., opening) all of the passgates 138, 134, 142 and 144. This decouples the sense amplifier 94 from the BLT and BLC lines 82 and 80 after it has sensed enough of the data value stored in the memory cell such that it can attain its steady state value more quickly. This is true because of the parasitic capacitances associated with the BLT and BLC lines 82 and 80 (and also the WBT and WBC lines 58 and 56 which are also coupled to the sense amp via the passgates 280 and 282) seen by the inputs of the sense amplifier 94.

One aspect of the column select circuit 78 is that the block read-write control circuit 125 (see FIG. 2) generates a separate ISO signal for each memory array block 54, so for all unselected memory blocks, the ISO signal remains inactive low during both read and write cycles to prevent the column select circuit 78 in unselected blocks from drawing dynamic current from the power supply. Due to this aspect, the memory device 50 of FIG. 1 has 32 memory array blocks 54, but only four memory array blocks are selected during each read or write cycle. In this way, only four memory array blocks 54 instead of 32 memory array blocks draw dynamic current during a read or a write cycle. Thus, this aspect of the invention means that the dynamic current drawn from the power supply during read and write cycles is only one-eighth the dynamic current drawn by known memory devices. Such a significant reduction in dynamic power use allows the memory device 10 to be used in low power applications such as where the memory device 50 is powered by a battery.

Although a specific circuit is shown in FIG. 22 for the column select circuit 78, it is understood that other similar circuitry may be used to obtain the same advantages. For example, the P-channel transistors may be N-channel, and the N-channel transistors may be P-channel. Furthermore, a gate other than the NAND gate 136 may be used to form the column select circuit 284.

FIGS. 23, 24, and 25 illustrate systems which include a memory device 50 that incorporates the invention. FIG. 23 shows a memory device 50 within a computer system 560. The computer system 560 includes a microprocessor and other input/output devices. In a preferred embodiment, the computer system 560 includes a full 32-bit high speed microprocessor, such as those sold by Intel, Motorola, IBM and other companies. The computer system 560 may have connected thereto various input devices 562 and output devices 564. Additional data storage devices 566 which may include hard drives, CD ROMs or other off-site storage are also typically connected to the computer system 560. Using the high speed memory device 50 of the present invention, the computer system 560 is able to write to and read from memory much faster than was previously possible with other standard memory devices. This allows the computer system 560 to perform all other operations much faster as well.

FIGS. 24 and 25 show additional specific uses for one embodiment of the memory device 50 according to the present invention. In one embodiment, the memory device 50 is a 32K×32-bit synchronous pipelined Burst SRAM, called a BRAM. It has pipelined output and can operate as a CMOS cache Burst SRAM. Burst operations can be initiated with either $\overline{\text{ADSP}}$ (processor address status) or $\overline{\text{ADSC}}$ (controller address status). A burst advance input $\overline{\text{ADV}}$, allows the next burst address to be generated internal to the BRAM. Cache burst read cycles are initiated with $\overline{\text{ADSP}}$ without regard to $\overline{\text{ADSC}}$ or $\overline{\text{BWE}}$, using the external address clocked into the on-chip address registers when $\overline{\text{ADSP}}$ is sampled low. All Chip Selects must be asserted for $\overline{\text{ADSP}}$ to begin the burst cycle. The output buffers will be enabled by $\overline{\text{OE}}$ when the BRAM is selected. If the device is going from a deselect to a select mode, the device will be selected and the outputs enabled on the following clock cycle. In a read operation, data accessed by the current registered address will be available at a time tKQ from the next rising clock edge in a pipelined fashion.

The $\overline{\text{ADV}}$ input is ignored on the clock edge that samples $\overline{\text{ADSx}}$ asserted, but is sampled on all subsequent clock edges. The address is incremented internally to the BRAM for each read burst access where $\overline{\text{BWE}}$ and $\overline{\text{GW}}$ are sampled high, $\overline{\text{ADV}}$ is asserted low, and both address strobes are high. Data is always valid at time tKQ for all Outputs (DQ0–31) from the rising edge of clock (K).

The $\overline{\text{ADV}}$ input (burst address advance) provides control of the burst counter. The $\overline{\text{ADV}}$ input controls subsequent burst data accesses after the first data of the burst cycle is processed. Each time $\overline{\text{ADV}}$ is active low for subsequent bursts at the rising edge of the clock input, the burst counter is advanced to the next burst address. The address is advanced before the operation. The BRAM will suspend the address burst sequence when the $\overline{\text{ADV}}$ pin is high during positive clock transitions. Upon completion of the full internal burst count, the address will wrap-around to its initial base address. The logic state of the $\overline{\text{LBO}}$ input determines the burst sequence as interleave (i486™ or Pentium™ for Intel bursts) or linear for other processors (RISC, PowerPC, Cyrix M1). The state of the $\overline{\text{LBO}}$ signal, whether high or low, controls the state of the CMODE signal of FIG. 21.

Write cycles are performed by disabling the outputs with $\overline{\text{OE}}$ prior to asserting $\overline{\text{BWE}}$. A global write enable ($\overline{\text{GW}}$=low) writes all 32 bits regardless of the state of $\overline{\text{BWE}}$ or individual byte write select inputs. When $\overline{\text{GW}}$ is high, one or more bytes can be written by asserting $\overline{\text{BWE}}$ and individual byte write selects ($\overline{\text{BW1-4}}$). A byte write table (not shown) lists which byte write selects controls DQ0–31. $\overline{\text{BWE}}$ is ignored on rising clock edges that sample $\overline{\text{ADSP}}$ low, but is sampled on all subsequent rising clock edges. Output buffers are disabled tKQHZ after K when $\overline{\text{BWE}}$ or $\overline{\text{GW}}$ is sampled low (independent of $\overline{\text{OE}}$). Data is clocked into the data input register when a proper write operation is implemented. The write cycles are internally self-timed, and are initiated by the rising edge of the clock input. A write burst cycle continues with the address incremented internal to the BRAM when $\overline{\text{BWE}}$ and $\overline{\text{ADV}}$ are sampled low at the next rising clock edge.

For one embodiment of the memory device 50, connected as shown in FIGS. 24 and 25, Read or Write operations can be initiated with $\overline{\text{ADSC}}$ instead of $\overline{\text{ADSP}}$. The differences of these inputs are noted as:

1. $\overline{\text{ADSP}}$ must be high when $\overline{\text{ADSC}}$ is asserted low to initiate a cycle with $\overline{\text{ADSC}}$.
2. All Write Enable signals are sampled on the positive going clock edge that samples $\overline{\text{ADSC}}$ low (with $\overline{\text{ADSP}}$ high).
3. $\overline{\text{ADSP}}$ is blocked when $\overline{\text{CE1}}$ is high. The memory device 50 can be selected with either $\overline{\text{ADSP}}$ or $\overline{\text{ADSC}}$, but can only be deselected with $\overline{\text{ADSC}}$ when $\overline{\text{CE1}}$ is high.

The device of FIG. 24 includes two memory devices 50 connected to a Pentium processor 570 to provide 256 KB cache SRAM. The Pentium processor 570, working with a cache controller 572, is able to have full 32-bit read/write access from each of the memory devices 50. The memory devices 50 include the self timed high speed write internally and therefore permit faster writing to the respective memory devices under the control of the Pentium processor 570 and the cache controller 572. The cache controller 572 inputs to the memory device 50 an instruction to access certain memory locations and provides the address for starting a burst count sequence. The cache controller 572 then strobes a clock to advance the burst count sequence. After the first burst count sequence has started, it can be assured that the address is fully propagated through the address decoders and they are now cleared for use in decoding a new address. Therefore, shortly after the first burst clock pulse, the cache controller 572 is free to load a new address into the address data pins of the memory device 50 so that they may begin propagating through the address decoders for storage in the storage latch 409 and presentation to begin the next burst sequence after the current burst sequence is completed. This can continue for as many burst cycles as desired. The memory device 50 can thus provide data to the main microprocessor 570 at the higher burst count rate continuously, for as long as desired.

Further, there is a timing window over which the cache controller 572 may have the option to present this new address data and still continuously operate at the high speed. Assume for the moment that the burst count is for eight clock cycles. The new address data can be presented over the time interval from the first clock cycle until the seventh clock cycle. Thus, if the new address data is not provided until the third or seventh clock cycle, it will still have sufficient time to propagate through the address decoders so that the new address data arrives at the storage latch 409 in sufficient time for the new burst sequence to start at the end of the old burst count sequence. Thus, after the cache controller 572 loads a first burst address into a memory device 50, it may proceed to perform other functions such as accessing other memory devices or interfacing with the microprocessor 570. This may continue for one, two or as many burst cycles as available, depending upon the tasks being performed by the cache controller 572. At its convenience, the cache controller 572 loads the next address data into the memory device 50 so that the burst count can continue at the same high rate of speed. As will be appreciated, if the memory device 50 is a DRAM and is outputting an entire page of information which may be upwards of 20–30 cycles, the cache controller 572 and microprocessor 570 have a large time window over which they may conveniently provide the new address data rather than having to be interrupted from some other task they are currently performing. This will significantly reduce the interrupts and free up the microprocessor 570 to be the controller of the system rather than be subject to interrupts from the memory devices 50 requesting additional instructions. This is particularly advantageous if a single cache controller 572 is controlling an entire bank of memory chips because the cache controller may conveniently provide the new address data on its own timing sequence within the window interval to the various banks of memory devices or the individual memory devices.

FIG. 25 illustrates the computer system 560 having a 512 KB cache comprising four memory devices 50 connected to the Pentium processor 570 and the cache controller 572 to provide additional data storage and burst operational capability. The memory device 50 thus provides an architecture for building a 32K×64-bit burstable L2 data cache SRAM array (256K bytes) by using only two (2) devices, as shown in FIG. 22. Four (4) devices are used to provide a 512K byte cache, see FIG. 25. The memory device 50 has three chip enables for easy depth expansion. The chip enables are registered to allow contention free operation when implementing a 512K byte, dual-bank cache configuration.

The invention has been described, including a large number of embodiments and alternative embodiments which may be used to implement the invention. As will be recognized, one embodiment of the invention includes an SRAM memory device. Any equivalent circuits which perform a similar function may be used and substituted for those described herein and thus fall within the claims of the present invention. The claims are therefore not limited by the description provided herein but are broad enough to cover and include alternative embodiments in equivalent circuitry for carrying out the claim features.

I claim:

1. A memory circuit having a plurality of data storage locations and an address associated with each data storage location, comprising:

a first decoded address storage circuit for storing a first decoded memory address and outputting the stored first decoded memory address;

a second decoded address storage circuit for storing a second decoded memory address and outputting the stored second decoded memory address;

an address access circuit coupled to the output of the first decoded address storage circuit for accessing the data storage location associated with the first decoded memory address in response to the first decoded memory address being output from the first decoded address storage circuit; and a control circuit coupled to the first decoded address storage circuit for transferring decoded memory address information from the second decoded address storage circuit to the first decoded address storage circuit.

2. A memory circuit as set forth in claim 1 wherein the second decoded memory address is stored in the second decoded address storage circuit before the address access circuit has completed accessing the data storage location associated with the first decoded memory address.

3. A memory circuit as set forth in claim 1, further including an address decoder circuit for receiving an address input to the memory device that is associated with any selected random storage location in the memory device and in response to this address outputting a decoded memory address to the second decoded address storage circuit.

4. A method for accessing data in a memory device having a plurality of data storage locations and an address associated with each data storage location, comprising the steps of:

receiving a first memory address that is associated with a first selected random data storage location in the memory device;

decoding the first memory address;

storing a first decoded memory address;

accessing the data stored in the memory device which is associated with the first decoded memory address;

receiving and decoding a second memory address that is associated with a second selected random data storage location in the memory device before the completion of the step of accessing the data stored in the memory device which is associated with the first decoded memory address;

outputting the data stored in the memory device which is located at the first selected random data storage location;

storing the second decoded memory address; and accessing the data stored in the memory device which is associated with the second decoded memory address after completion of the step of accessing the data stored in the memory device which is associated with the first decoded memory address.

5. The method of claim 4, further including the step of:

decoding at least a portion of the second memory address before the completion of the step of accessing the data stored in the memory device which is associated with the first decoded memory address.

6. The method according to claim 5, further including the step of completing the decoding of the second memory address and storing the second decoded memory address before outputting the data stored in the memory device which is associated with the first decoded memory address.

7. A memory circuit having a plurality of data storage locations and an address associated with each data storage location, comprising:

a first storage latch for storing a first decoded memory address, the first storage latch having an input for receiving the first decoded memory address, a clock terminal for receiving a clock signal K1 to control the transfer of the first decoded memory address from the input to the first storage latch, and an output for outputting the first decoded memory address stored in the first storage latch;

a second decoded address storage circuit for storing a second decoded memory address and outputting the stored second decoded memory address;

an address access circuit coupled to the output of the first decoded address storage circuit for accessing the data storage location associated with the first decoded memory address in response to the first decoded memory address being output from the first decoded address storage circuit; and a control circuit coupled to the first decoded address storage circuit for transferring decoded memory address information from the second decoded address storage circuit to the first decoded address storage circuit.

8. A memory circuit as set forth in claim 7 wherein the second decoded address storage circuit is a second storage latch for storing the second decoded memory address, the second storage latch having an input for receiving the second decoded memory address, a clock terminal for receiving a clock signal K2 to control the transfer of the second decoded memory address from the input to the second storage latch, and an output for outputting the second decoded memory address stored in the second storage latch.

9. A memory circuit as set forth in claim 8 wherein the control circuit provides the clock signals K1 and K2 to the first and second storage latches, respectively, so that the clock K2 stores the second decoded memory address in the second storage latch before the counter circuit has completed accessing the data storage location associated with the first decoded memory address.

10. A memory circuit as set forth in claim 9 wherein the control circuit provides the clock signal K1 to the first storage latch immediately after the counter circuit has completed accessing the data storage location associated with the first decoded memory.

11. A memory circuit having a plurality of data storage locations and an address associated with each data storage location, comprising:

a first decoded address storage circuit for storing a first decoded memory address and outputting the stored first decoded memory address;

a second decoded address storage circuit for storing a second decoded memory address and outputting the stored second decoded memory address;

an address access circuit coupled to the output of the first decoded address storage circuit for accessing the data storage location associated with the first decoded memory address in response to the first decoded memory address being output from the first decoded address storage circuit, the address access circuit including a burst counter circuit which accesses the data storage location associated with the first decoded memory address and also accesses three additional data storage locations, the decoded memory addresses associated with these three additional data storage locations being generated by the burst counter circuit using the first decoded memory address; and a control circuit coupled to the first decoded address storage circuit for transferring decoded memory address information from the second decoded address storage circuit to the first decoded address storage circuit.

12. A method for accessing data in a memory device having a plurality of data storage locations and an address associated with each data storage location, comprising the steps of:

receiving a first memory address that is associated with a first selected random data storage location in the memory device;

decoding the first memory address;

storing a first decoded memory address;

accessing the data stored in the memory device which is associated with the first decoded memory address by accessing three additional data storage locations, the decoded memory addresses associated with these three additional data storage locations being determined from the first decoded memory address;

receiving a second memory address that is associated with a second selected random data storage location in the memory device before the completion of the step of accessing the data stored in the memory device which is associated with the first decoded memory address;

outputting the data stored in the memory device which is located at the first selected random data storage location;

storing the second decoded memory address; and accessing the data stored in the memory device which is associated with the second decoded memory address after completion of the step of accessing the data stored in the memory device which is associated with the first decoded memory address.

13. A method for accessing data in a memory device having a plurality of data storage locations and an address associated with each data storage location, comprising the steps of:

receiving a first memory address that is associated with a first selected random data storage location in the memory device;

decoding the first memory address;

storing a first decoded memory address;

accessing the data stored in the memory device which is associated with the first decoded memory address;

receiving a second memory address that is associated with a second selected random data storage location in the memory device before the completion of the step of accessing the data stored in the memory device which is associated with the first decoded memory address;

outputting the data stored in the memory device which is located at the first selected random data storage location;

storing the second decoded memory address; and accessing the data stored in the memory device which is associated with the second decoded memory address after completion of the step of accessing the data stored in the memory device which is associated with the first decoded memory address, including accessing three additional data storage locations, the decoded memory addresses associated with these three additional data storage locations being determined from the second decoded memory address.

* * * * *